US009054055B2

(12) United States Patent
Asaki et al.

(10) Patent No.: US 9,054,055 B2
(45) Date of Patent: Jun. 9, 2015

(54) DISPLAY AND ELECTRONIC DEVICE WITH COLOR FILTER HAVING A SEMI-TRANSMISSIVE REGION

(75) Inventors: Reo Asaki, Tokyo (JP); Jiro Yamada, Kanagawa (JP)

(73) Assignee: SONY CORPORATION (JP)

( * ) Notice: Subject to any disclaimer, the term of this patent is extended or adjusted under 35 U.S.C. 154(b) by 453 days.

(21) Appl. No.: 13/410,507

(22) Filed: Mar. 2, 2012

(65) Prior Publication Data

US 2012/0250303 A1 Oct. 4, 2012

(30) Foreign Application Priority Data

Mar. 30, 2011 (JP) ................................. 2011-075470

(51) Int. Cl.
*H01J 1/62* (2006.01)
*H01L 27/32* (2006.01)

(52) U.S. Cl.
CPC .................... *H01L 27/322* (2013.01)

(58) Field of Classification Search
USPC ................................. 313/504–512
See application file for complete search history.

(56) References Cited

U.S. PATENT DOCUMENTS

| 6,061,109 | A * | 5/2000 | Suginoya et al. ............. 349/106 |
|---|---|---|---|
| 6,445,005 | B1 * | 9/2002 | Yamazaki et al. .............. 257/72 |
| 7,282,856 | B2 * | 10/2007 | Iwase et al. ................... 313/512 |
| 8,198,805 | B2 * | 6/2012 | Takagi et al. ................. 313/506 |
| 8,395,308 | B2 * | 3/2013 | Asaki ........................... 313/483 |
| 2006/0214579 | A1 * | 9/2006 | Iwase et al. ................... 313/512 |
| 2006/0290276 | A1 * | 12/2006 | Cok et al. ..................... 313/512 |
| 2007/0123135 | A1 * | 5/2007 | Yang et al. ...................... 445/24 |
| 2009/0153036 | A1 * | 6/2009 | Gonda .......................... 313/504 |
| 2009/0206726 | A1 * | 8/2009 | Yamazaki et al. ............. 313/498 |
| 2011/0062859 | A1 * | 3/2011 | Kawamura ..................... 313/504 |
| 2011/0220924 | A1 * | 9/2011 | Fukuda ........................... 257/91 |

FOREIGN PATENT DOCUMENTS

JP 2010-008861 1/2010

* cited by examiner

*Primary Examiner* — Sikha Roy
(74) *Attorney, Agent, or Firm* — Sheridan Ross P.C.

(57) ABSTRACT

A display capable of suppressing color mixture caused by the diffraction of the light passing through the adjacent transmission color region of the color filter, even when a size of a light emitting element is small, and an electronic device including the display are provided. The display includes a plurality of light emitting elements, and a color filter having a transmission color region facing the plurality of light emitting elements, and a semi-transmissive region provided at a part of the transmission color region.

20 Claims, 19 Drawing Sheets

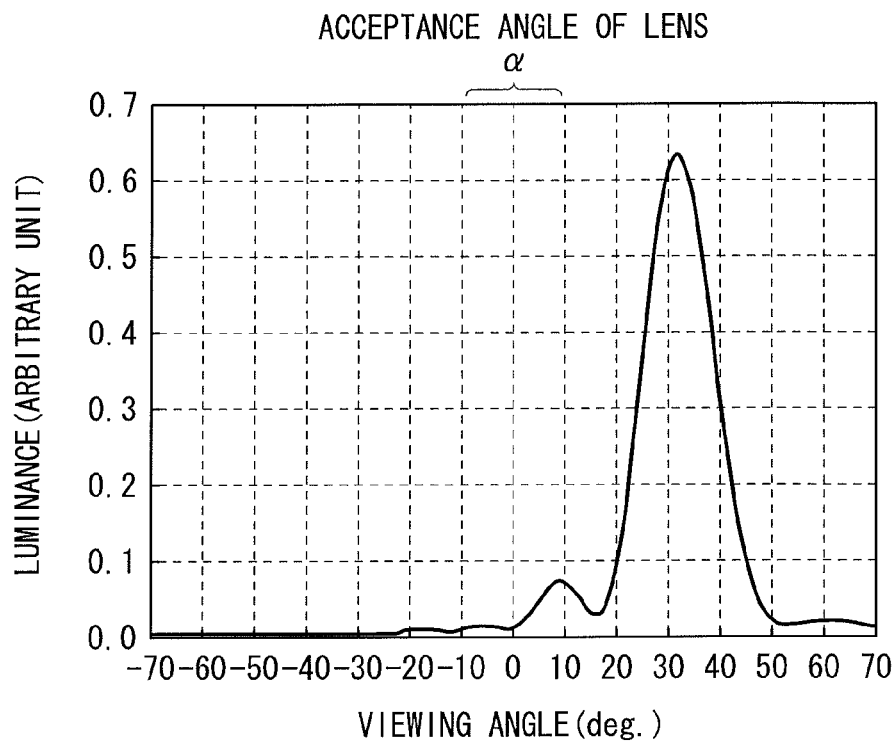

FIG. 14

| | CONTENTS | EFFECT OF REDUCING COLOR MIXING RATE |
|---|---|---|
| COMPARATIVE EXAMPLE | EXISTING BLACK MATRIX (FIG. 13) | REFERENCE VALUE |
| FIRST EXAMPLE | SEMI-TRANSMISSIVE FILM AT SURFACE ON SIDE AWAY FROM ORGANIC EL ELEMENT (FIG. 3) | -48% |
| SECOND EXAMPLE | SEMI-TRANSMISSIVE FILM AT SURFACE ON SIDE CLOSE TO ORGANIC EL ELEMENT (FIG. 4) | -63% |
| THIRD EXAMPLE | FIRST SEMI-TRANSMISSIVE FILM AND SECOND SEMI-TRANSMISSIVE FILM (FIG. 5) | -66% |
| FOURTH EXAMPLE | SEMI-TRANSMISSIVE FILM AND SHIELDING FILM (FIG. 7) | -44% |

FIG. 15

DISPLAY AND ELECTRONIC DEVICE WITH COLOR FILTER HAVING A SEMI-TRANSMISSIVE REGION

BACKGROUND

The present disclosure relates to a self-luminous display using organic electroluminescence (EL), inorganic EL, or the like, and an electronic device provided with the display.

In a full-color display, when a white-light emitting element is used, a color image is displayed by producing light of three primary colors of red, green, and blue through the use of a color filter. Also, in a case where light emitting elements of three primary colors of red, green, and blue are used, a color filter may be used to improve color purity. Further, in order to improve contrast, a light-shielding black matrix is provided at the boundaries of the color filter.

In a case where a color filter and a light-shielding black matrix are used together, the black matrix serves as a diffraction grating, and light passing through the adjacent color filter diffracts, causing color mixture. In order to suppress a diffraction phenomenon caused by the black matrix, provision of an optical concentration gradient from an edge to an aperture of the black matrix has been suggested (for example, see Japanese Unexamined Patent Application Publication No. 2010-8861).

SUMMARY

However, there is such a disadvantage that it is extremely difficult to provide the optical concentration gradient at the edge of the black matrix, in a case where the size of a light emitting element is small.

In view of the foregoing, it is desirable to provide a display capable of suppressing color mixture caused by diffraction of light passing through an adjacent color filter even when the size of a light emitting element is small, and an electronic device provided with the display.

According to an embodiment of the present disclosure, there is provided a display including a plurality of light emitting elements; and a color filter having a transmission color region facing the plurality of light emitting elements, and a semi-transmissive region provided at a part of the transmission color region.

In the display of the embodiment of the present disclosure, light produced in each of the light emitting elements is extracted after passing through the transmission color region facing the light emitting element, but a part of the produced light enters the adjacent transmission color region. Here, the semi-transmissive region is provided at the part of the transmission color region and thus, the part of the light entering the adjacent transmission color region passes through the semi-transmissive region. Therefore, there occurs a phase difference between the light passing through the adjacent transmission color region and the light passing through the adjacent transmission color region as well as the semi-transmissive region, which cancel out each other. This reduces color mixture caused by diffraction of the light passing through the adjacent transmission color region.

According to an embodiment of the present disclosure, there is provided an electronic device including the display having a plurality of light emitting elements, and a color filter having a transmission color region facing the plurality of light emitting elements, and a semi-transmissive region provided at a part of the transmission color region.

In the electronic device according to the embodiment of the present disclosure, an image is displayed by the display.

According to the display or the electronic device in the embodiment of the present disclosure, the semi-transmissive region is provided at the part of the transmission color region of the color filter. Therefore, it is possible to suppress color mixture caused by the diffraction of the light passing through the adjacent transmission color region of the color filter, even when the size of the light emitting element is small.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve for explaining the principles of the technology.

FIG. 14 is a diagram illustrating luminance of light passing through an adjacent transmission color region.

FIG. 15 is a diagram illustrating an effect of reducing color mixing rate of the semi-transmissive region in each of the first example to the fourth example, in comparison with a case in which an existing black matrix illustrated in FIG. 13 is provided.

DETAILED DESCRIPTION

An embodiment of the present disclosure will be described below in detail with reference to the drawings.

Figure 1:
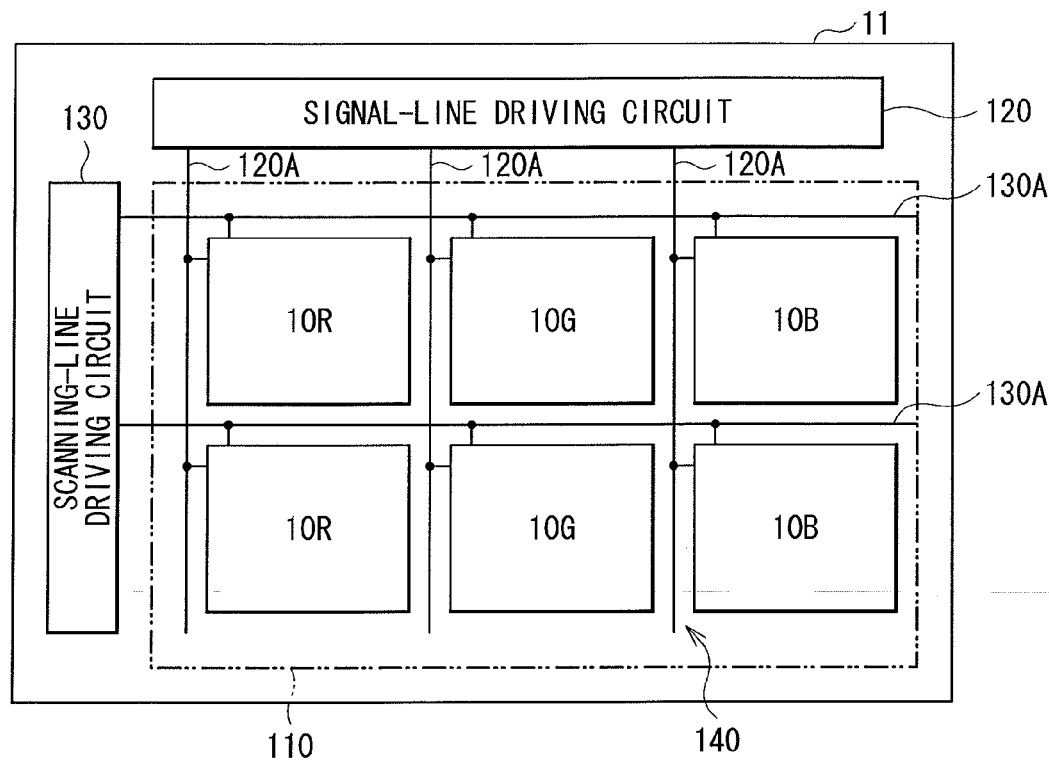
FIG. 1 is a diagram illustrating a configuration of a display according to an embodiment of the present disclosure.

FIG. 1 illustrates a configuration of a display according to an embodiment of the present disclosure. This display is a small high-definition organic EL display used for a view finder of a digital single-lens reflex camera, a head mount display, and the like, and has, for example, a display region 110 in which a plurality of pixels 10R, 10G, and 10B to be described later are arranged in the form of a matrix, on a substrate 11 made of glass or the like. Around the display region 110, there are provided a signal-line driving circuit 120 and a scanning-line driving circuit 130 that are drivers for image display.

Figure 2:
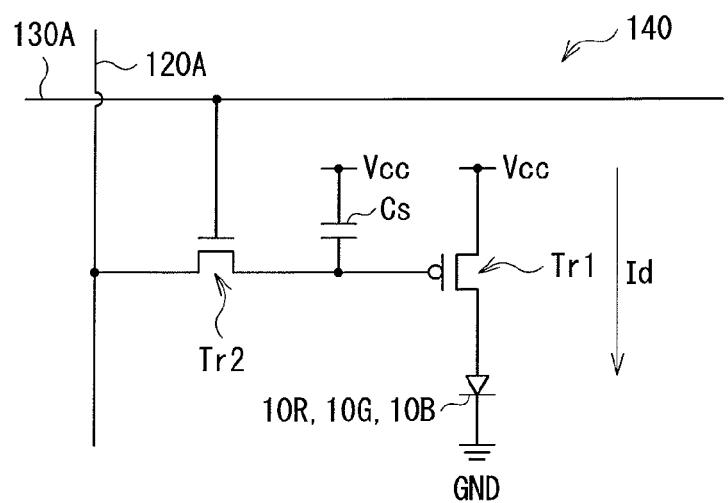
FIG. 2 is a diagram illustrating an example of a pixel driving circuit illustrated in FIG. 1.

In the display region 110, a pixel driving circuit 140 is provided. FIG. 2 illustrates an example of the pixel driving circuit 140. The pixel driving circuit 140 is an active driving circuit provided below a first electrode 32 to be described later. The pixel driving circuit 140 has, for example, a drive transistor Tr1 as well as a write transistor Tr2, a capacitor (retention capacitor) Cs, and an organic EL device 10 connected to the drive transistor Tr1 in series between a first power supply line (Vcc) and a second power supply line (GND). One electrode of the capacitor Cs is connected between the drive transistor Tr1 and the write transistor Tr2, and the other electrode is connected between the drive transistor Tr1 and the organic EL device 10.

In the pixel driving circuit 140, a plurality of signal lines 120A are arranged in a column direction, and a plurality of scanning lines 130A are arranged in a row direction. The intersection of each of the signal lines 120A and each of the scanning lines 130A corresponds to any one (a subpixel) of the organic EL devices 10. Each of the signal lines 120A is connected to the signal-line driving circuit 120, and an image signal is supplied from the signal-line driving circuit 120 to a source electrode of the write transistor Tr2 via the signal line 120A. Each of the scanning lines 130A is connected to the scanning-line driving circuit 130, and a scanning signal is sequentially supplied from the scanning-line driving circuit 130 to a gate electrode of the write transistor Tr2 via the scanning line 130A.

Figure 3:
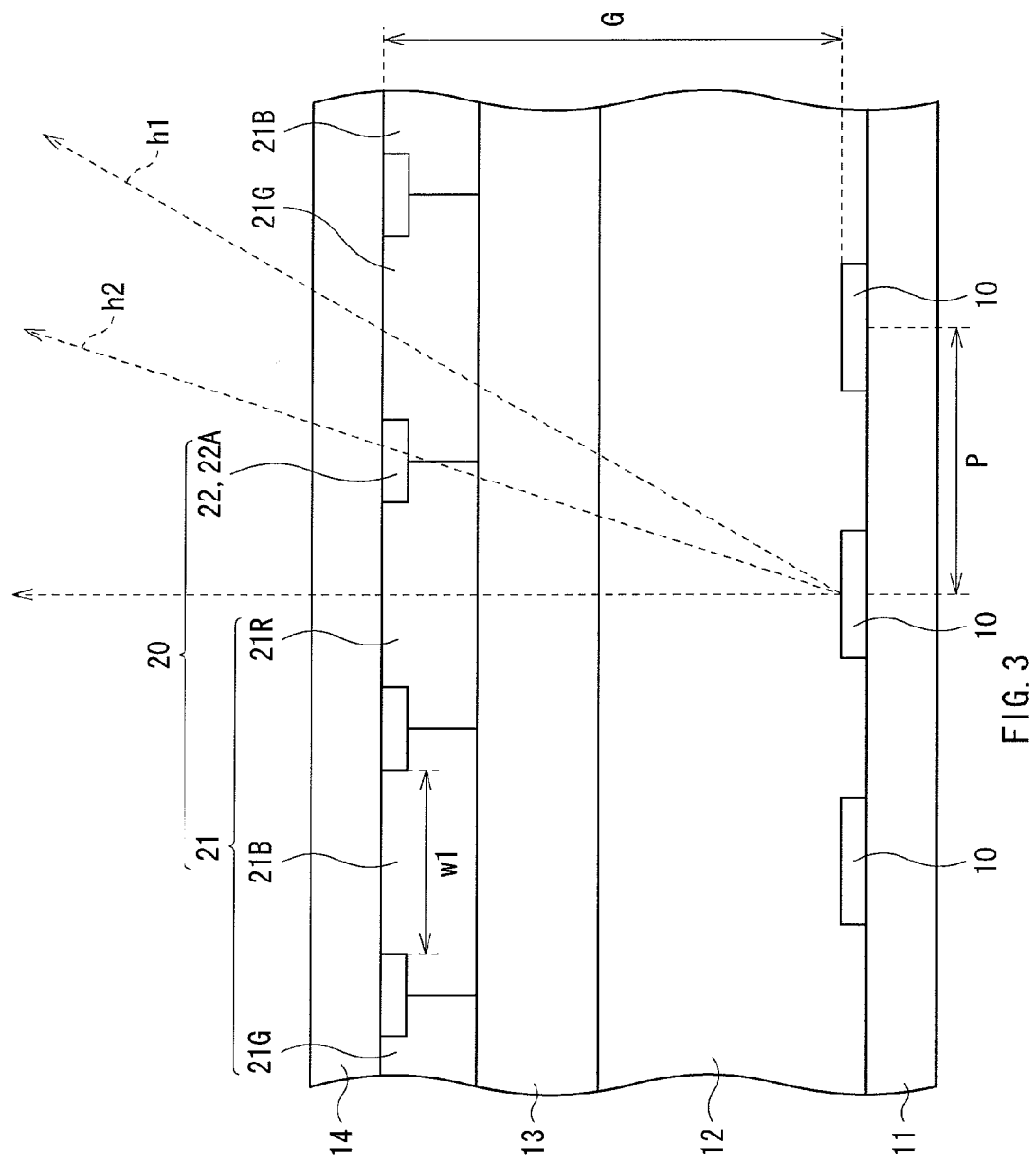
FIG. 3 is a cross-sectional diagram illustrating a schematic configuration of a display region illustrated in FIG. 1, and also illustrating a first example of a semi-transmissive region.

FIG. 3 illustrates a cross-sectional configuration of a part of the display region 110 illustrated in FIG. 1. Each of the pixels 10R, 10G, and 10B is, for example, a pixel that produces light of any of three primary colors (red, green, and blue) based on a combination of a plurality of organic EL devices 10 emitting white light and a color filter 20. A pitch p (a distance between centers) of the organic EL devices 10 is, for example, 30 μm or less, and specifically, for example, approximately 2 μm to 3 μm. In other words, this display is a so-called microdisplay, in which the size of the organic EL device 10 is extremely small. It is to be noted that an eyepiece (not illustrated) is provided on the display, and a user views an image displayed on the display, which is enlarged through the eyepiece. Therefore, what the user may view is only a part of the image displayed on the display, the part being in a range of an acceptance angle of the eyepiece.

The organic EL devices 10 are arranged in rows and columns on the substrate 11, and is covered by a protective film 12. Onto the protective film 12, a sealing substrate 14 made of glass or the like is adhered over the entire surface, with an adhesion layer 13 in between. Provided on a surface on the substrate 11 side of this sealing substrate 14 is the color filter 20. Therefore, there is a distance (gap) G of, for example, around 7 μm, between the organic EL device 10 and a top surface (the surface on the sealing substrate 14 side) of the color filter 20.

The protective film 12, for example, has a thickness of 0.5 μm to 10 μm both inclusive, and is made of silicon nitride (SiN). The adhesion layer 13 is made of, for example, UV curing resin or thermosetting resin. The sealing substrate 14 is located on a second electrode 35 (to be described later) side of organic EL device 10, and seals the organic EL device 10 with the adhesion layer 13. The sealing substrate 14 is made of, for example, a material such as glass, transparent for light produced in the organic EL device 10.

The color filter 20 has a transmission red region 21R, a transmission green region 21G, and a transmission blue region 21B (which may be hereinafter collectively referred to as a "transmission color region 21") facing the organic EL devices 10. At a part of the transmission color region 21, a semi-transmissive region 22 is provided. Therefore, in this display, even when the size of the organic EL device 10 is small, it is possible to suppress color mixture caused by diffraction of light passing through the adjacent transmission color region 21.

The transmission color region 21 is provided to extract white light produced in the organic EL device 10, as colored light of red, green, or blue, and has the transmission red region 21R, the transmission green region 21G, and the transmission blue region 21B as described above. The transmission red region 21R, the transmission green region 21G, and the transmission blue region 21B are sequentially disposed corresponding to the organic EL devices 10. The transmission red region 21R, the transmission green region 21G, and the transmission blue region 21B are each configured by using a colored layer made of resin mixed with a pigment, and are each adjusted to have high light transmittance in an intended red, green, or blue wavelength region, and low light transmittance in other wavelength regions, depending on the selection of a pigment.

The semi-transmissive region 22 is a region in which a part of the transmittance of the transmission color region 21 is made variable, by providing a semi-transmissive film to be described later, at a part of the transmission color region 21. It is possible to adjust the transmittance, depending on the material, thickness, or the like of the semi-transmissive film.

It is desirable that the semi-transmissive region 22 be provided at a position where a part of light entering from one of the organic EL devices 10 into the transmission color region 21 adjacent to the transmission color region 21 facing this organic EL device 10 (hereinafter simply referred to as the "adjacent transmission color region 21") is allowed to pass through the semi-transmissive region 22. Specifically, it is preferable that the semi-transmissive region 22 be provided to face the border between the plurality of organic EL devices 10. This makes it possible to suppress color mixture caused by diffraction of light, while making an aperture width w1 of the transmission color region 21 large, without interfering extraction of light in a direction perpendicular to a light-emission surface (in a direction of a 0-degree viewing angle).

Further, the semi-transmissive region 22 also has a function of improving contrast by absorbing external light entering from the sealing substrate 14 side, namely, a function similar to that of an existing black matrix.

First Example of Semi-Transmissive Region 22

Such a semi-transmissive region 22 is configured by using a semi-transmissive film 22A provided at a surface of the colored layer of the transmission color region 21, on a side away from the organic EL device 10 (i.e., the surface on the sealing substrate 14 side), as illustrated in FIG. 3, for example. The semi-transmissive film 22A, for example, has a thickness of 90 nm and a line width of 1.2 μm, and is made of titanium nitride (TiN). In this case, it is possible to form the semi-transmissive region 22 easily, by directly forming the semi-transmissive film 22A made of titanium nitride on the sealing substrate 14 in a production process.

Second Example of Semi-Transmissive Region 22

Figure 4:
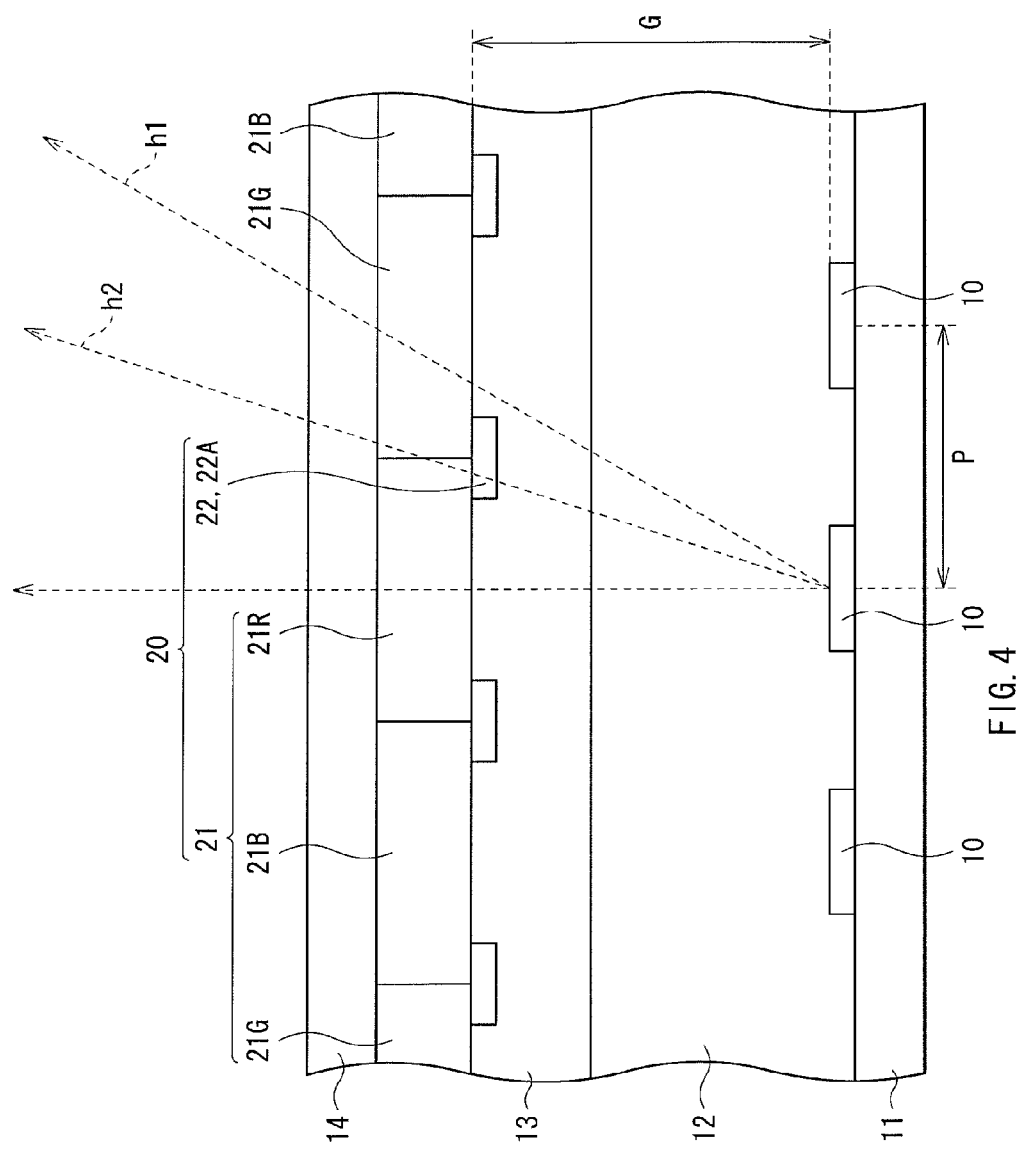
FIG. 4 is a diagram illustrating a second example of the semi-transmissive region.

Further, as illustrated in FIG. 4, the semi-transmissive region 22 may be configured by using a semi-transmissive film 22A provided at a surface of the colored layer of the transmission color region 21, on a side close to the organic EL device 10 (i.e., the surface on the substrate 11 side). The semi-transmissive film 22A, for example, has a thickness of 90 nm and a line width of 1.2 μm, and is made of titanium nitride or black resin in which optical density is reduced.

Third Example of Semi-Transmissive Region 22

Figure 5:
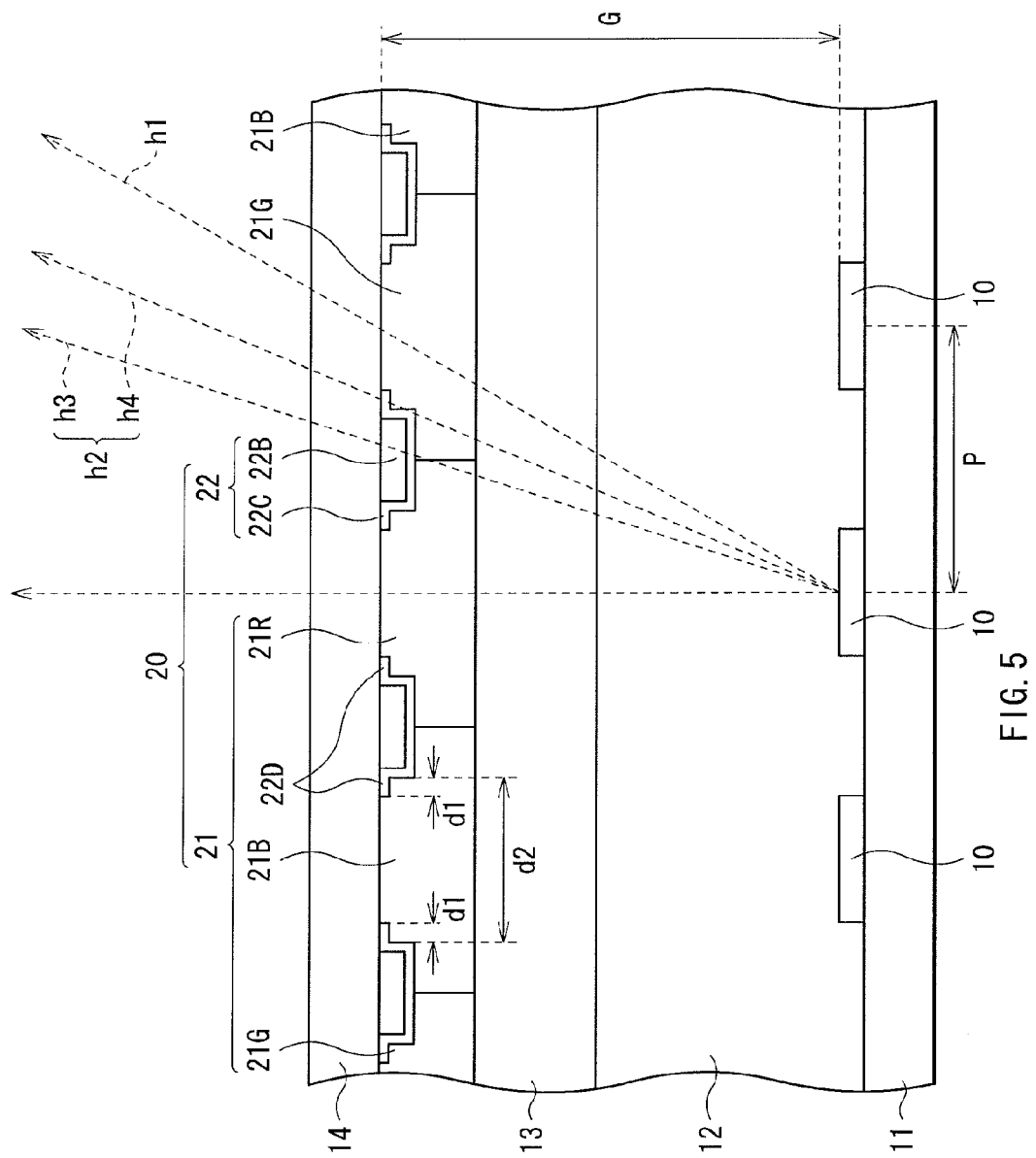
FIG. 5 is a diagram illustrating a third example of the semi-transmissive region.

Furthermore, as illustrated in FIG. 5, the semi-transmissive region 22 may have a first semi-transmissive film 22B provided at a surface of the colored layer of the transmission color region 21, on a side away from the organic EL device 10 (i.e., the surface on the sealing substrate 14 side), and a second semi-transmissive film 22C covering surfaces (an underside and sides) of the first semi-transmissive film 22B. The second semi-transmissive film 22C has a protruding part 22D at a surface of the colored layer around the first semi-transmissive film 22B. The first semi-transmissive film 22B, for example, has a thickness of 90 nm, and a line width of 1.2 μm, and is made of titanium nitride. The second semi-transmissive film 22C, for example, has a thickness of 30 nm and a line width of 1.8 μm, and is made of titanium nitride. A protruding amount d1 of the protruding part 22D is 0.3 μm on one side of the transmission color region 21, i.e., 0.6 μm on both sides in total.

It is desirable that the protruding amount d1 of the protruding part 22D be equal to or less than ¼ (a quarter) of an aperture width d2 of the first semi-transmissive film 22B, in total on both sides of the transmission color region 21. This is because when the protruding amount d1 is larger than this, an aperture ratio of the transmission color region 21 decreases.

Figure 6:
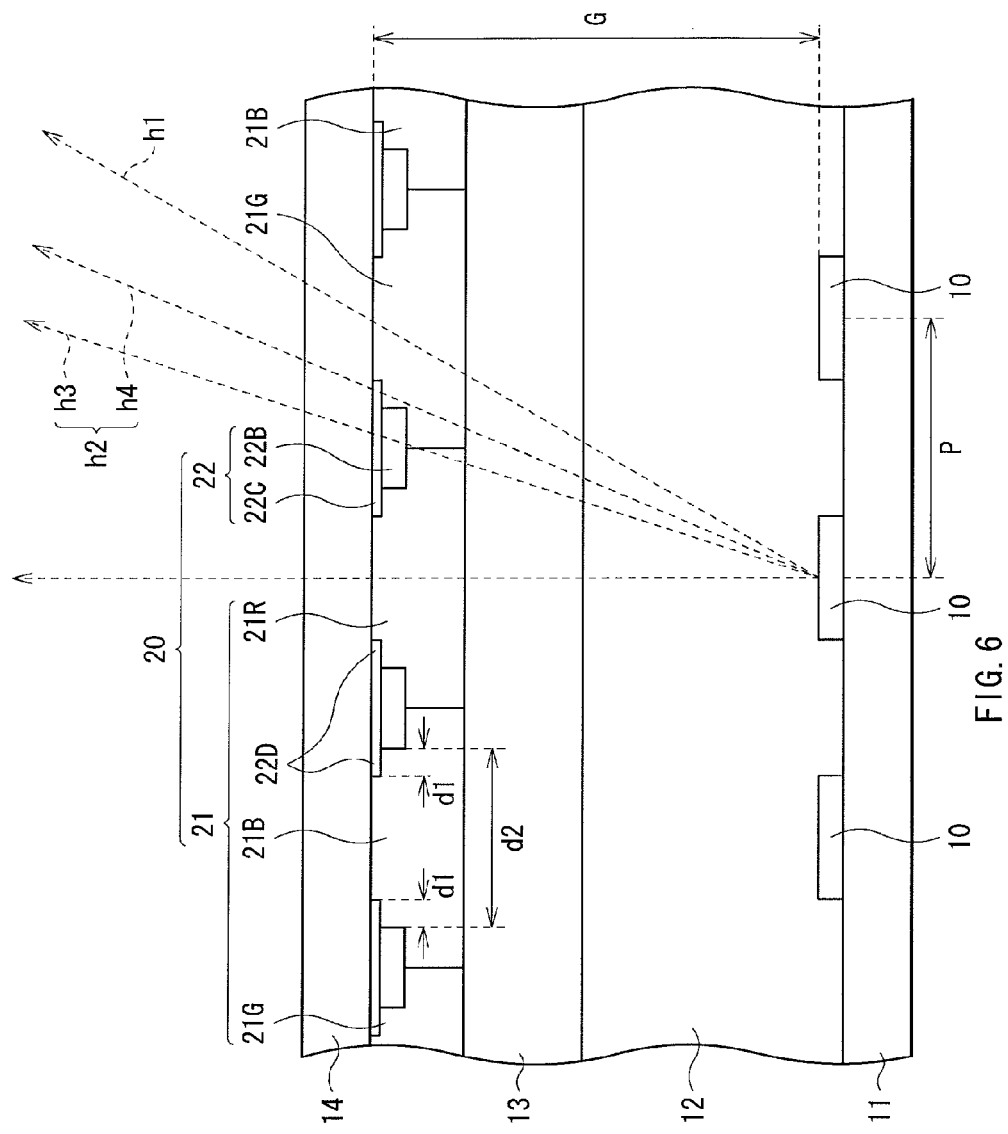
FIG. 6 is a diagram illustrating another example of the third example.

It is to be noted that a lamination order of the first semi-transmissive film 22B and the second semi-transmissive film 22C is not limited to the example illustrated in FIG. 5. For instance, as illustrated in FIG. 6, the semi-transmissive region 22 may have a second semi-transmissive film 22C provided at a surface of the colored layer of the transmission color region 21, on a side away from the organic EL device 10 (i.e., the surface on the sealing substrate 14 side), and a first semi-transmissive film 22B provided on a part of a surface (an underside) of the second semi-transmissive film 22C. The second semi-transmissive film 22C has a protruding part 22D at a surface of the colored layer around the first semi-transmissive film 22B.

Fourth Example of Semi-Transmissive Region 22

Figure 7:
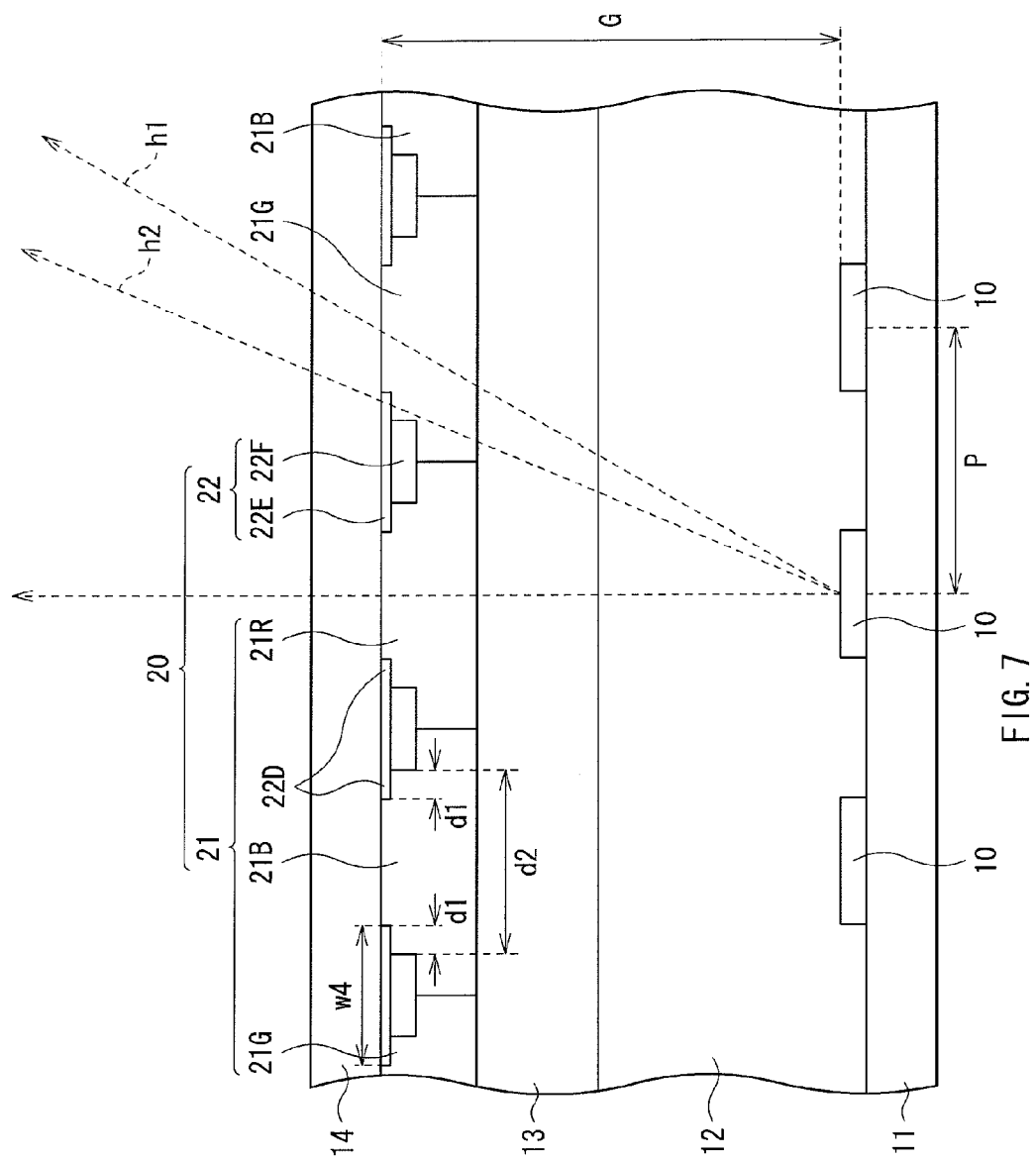
FIG. 7 is a diagram illustrating a fourth example of the semi-transmissive region.

Alternatively, as illustrated in FIG. 7, the semi-transmissive region 22 may have a semi-transmissive film 22E provided at a surface of the colored layer of the transmission color region 21, on a side away from the organic EL device 10 (i.e., the surface on the sealing substrate 14 side), and a shielding film 22F provided on a part of a surface (an underside) of the semi-transmissive film 22. The semi-transmissive film 22E has a protruding part 22G at a surface of the colored layer around the shielding film 22F. The semi-transmissive film 22E, for example, has a thickness of 30 nm and a line width of 1.8 μm, and is made of titanium nitride. The shielding film 22F, for example, has a thickness of 160 nm and a line width of 1.2 μm, and is made of titanium (Ti). A protruding amount d1 of the protruding part 22G is 0.3 μm on one side of the transmission color region 21, i.e., 0.6 μm on both sides in total.

It is desirable that the protruding amount d1 of the protruding part 22G be equal to or less than ¼ (a quarter) of an aperture width d2 of the shielding film 22F, in total on both sides of the transmission color region 21. This is because when the protruding amount d1 is larger than this, the aperture ratio of the transmission color region 21 decreases.

Figure 8:
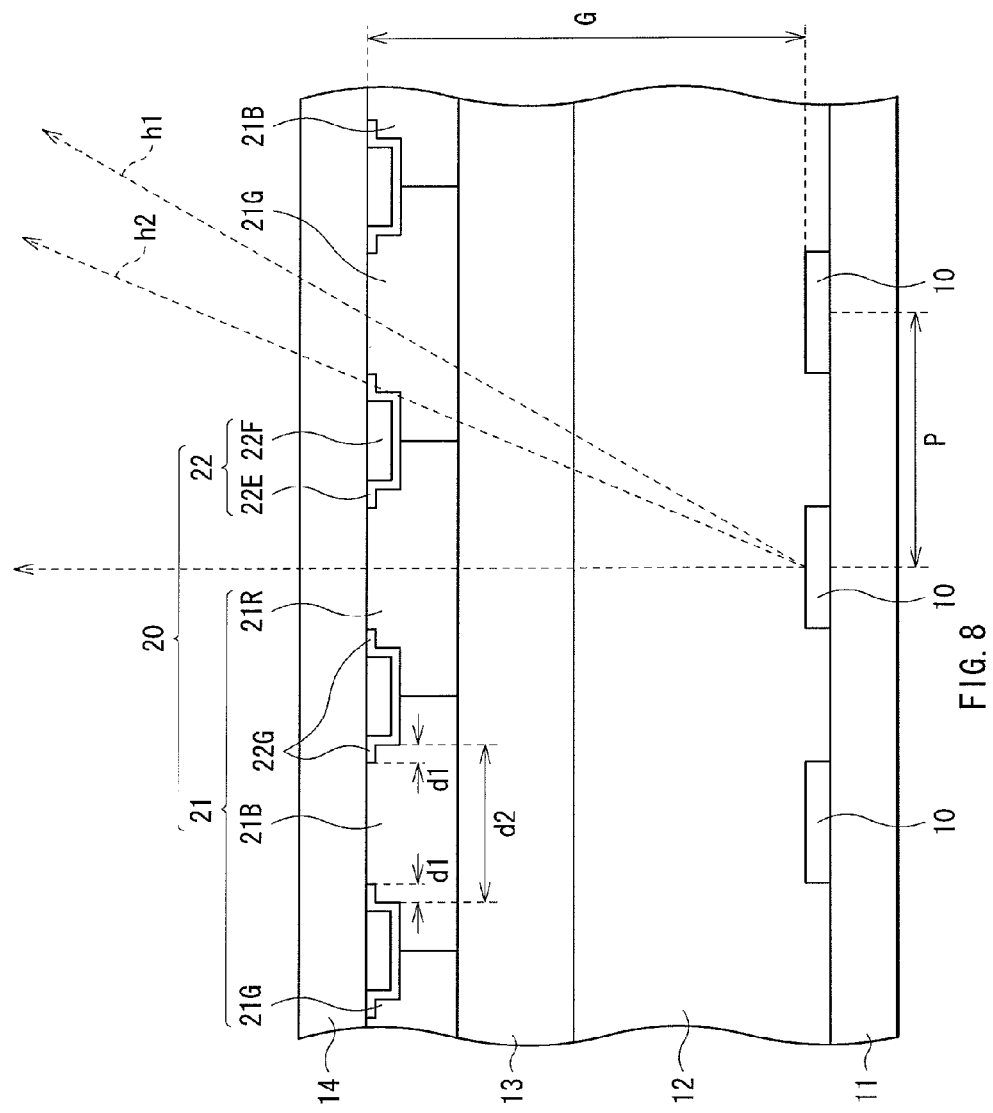
FIG. 8 is a diagram illustrating another example of the fourth example.

It is to be noted that the lamination order of the semi-transmissive film 22E and the shielding film 22F is not limited to the example illustrated in FIG. 7. For example, as illustrated in FIG. 8, the semi-transmissive region 22 may have the shielding film 22F provided at a surface of the colored layer of the transmission color region 21, on a side away from the organic EL device 10 (i.e., the surface on the sealing substrate 14 side), and the semi-transmissive film 22E covering surfaces (an underside and sides) of the shielding film 22F. The semi-transmissive film 22E has a protruding part 22G at a surface of the colored layer around the shielding film 22F.

Fifth Example of Semi-Transmissive Region 22

Figure 9:
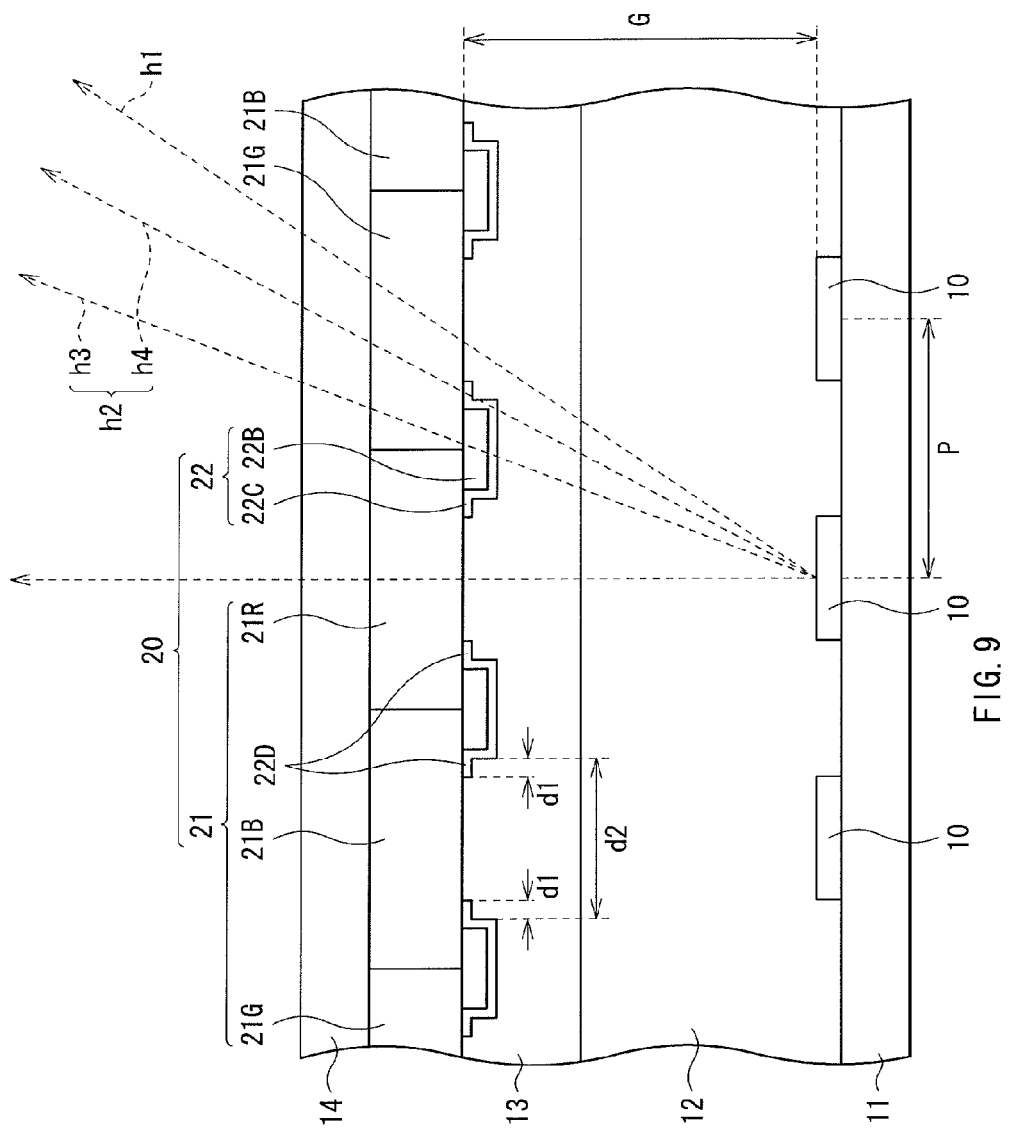
FIG. 9 is a diagram illustrating a fifth example of the semi-transmissive region.
Figure 10:
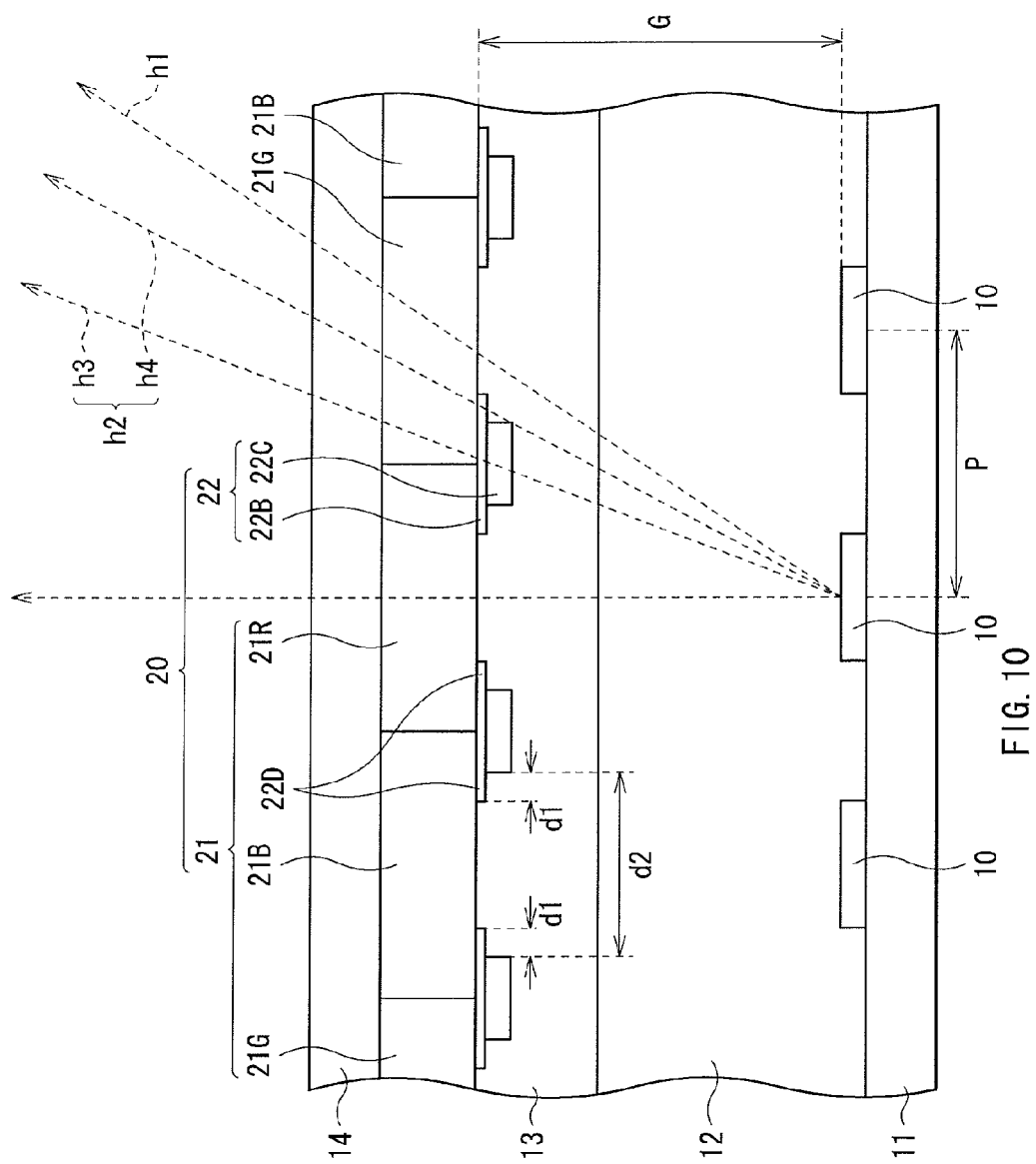
FIG. 10 is a diagram illustrating another example of the fifth example.

It is to be noted that the semi-transmissive region 22 including the first semi-transmissive film 22B and the second semi-transmissive film 22C in the third example may be provided at a surface of the colored layer of the transmission color region 21, on a side close to the organic EL device 10 (i.e., the surface on the substrate 11 side), as illustrated in FIG. 9 or FIG. 10.

Sixth Example of Semi-Transmissive Region 22

Figure 11:
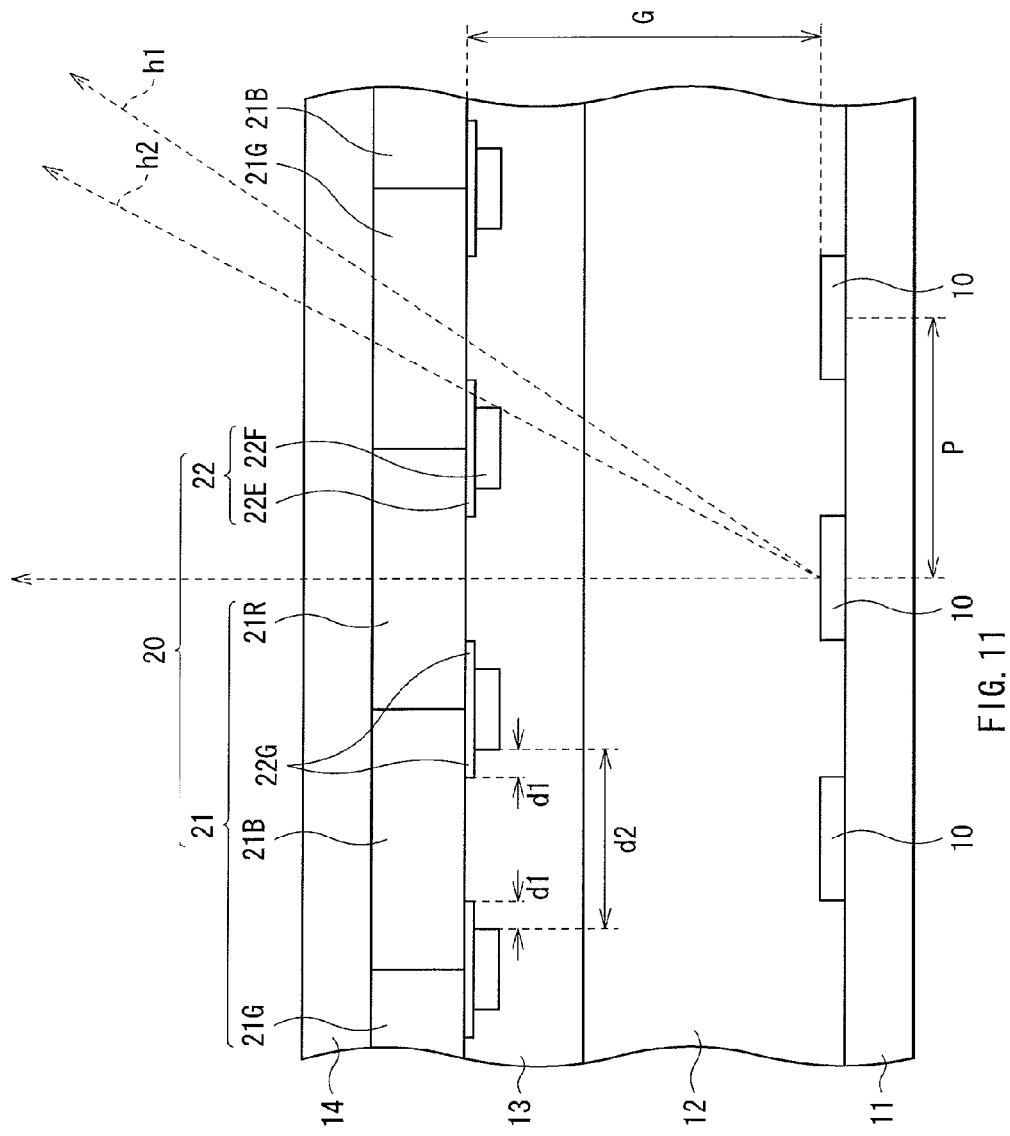
FIG. 11 is a diagram illustrating a sixth example of the semi-transmissive region.
Figure 12:
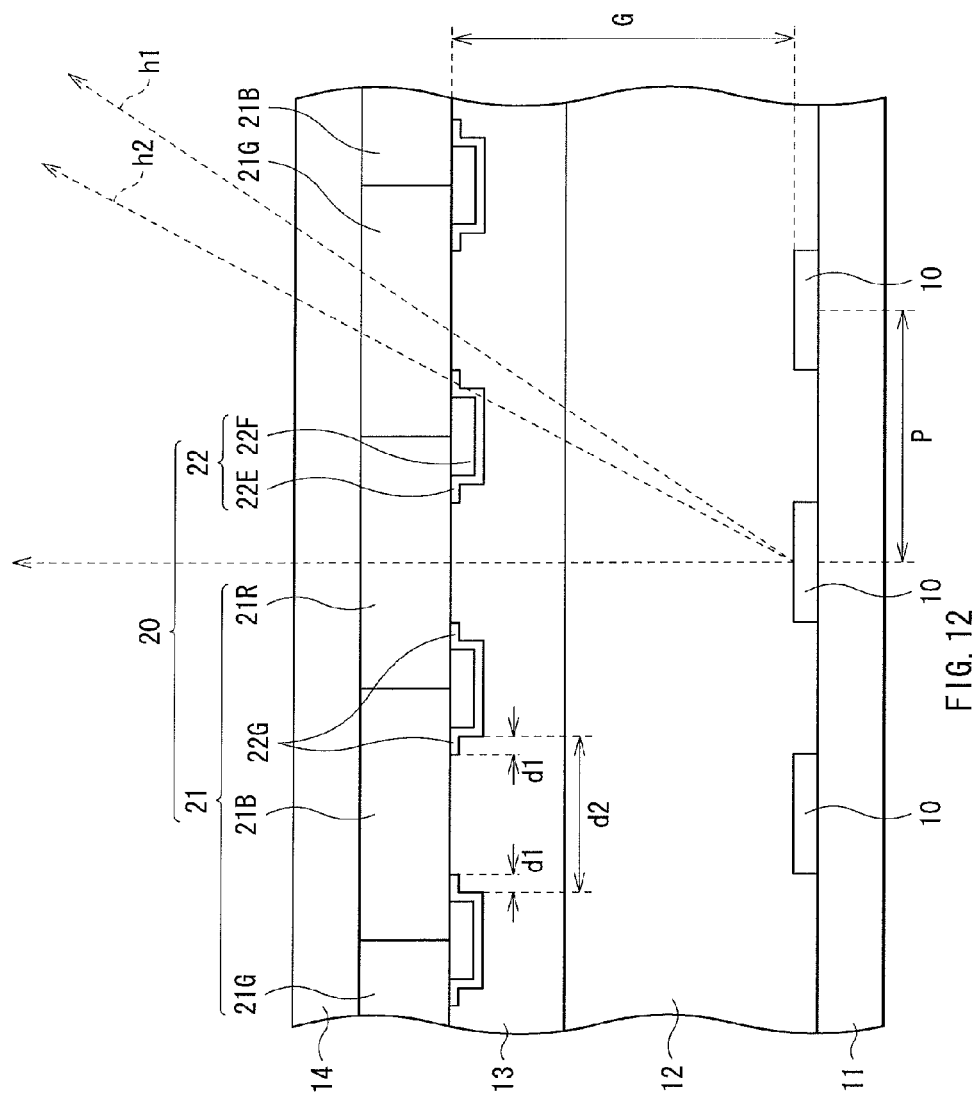
FIG. 12 is a diagram illustrating another example of the sixth example.

Further, the semi-transmissive region 22 including the semi-transmissive film 22E and the shielding film 22F in the fourth example may be provided at a surface of the colored layer of the transmission color region 21, on a side close to the organic EL device 10 (i.e., the surface on the substrate 11 side), as illustrated in FIG. 11 or FIG. 12.

In the display, the scanning signal is supplied from the scanning-line driving circuit 130 to each pixel through the gate electrode of the write transistor Tr2, and the image signal from the signal-line driving circuit 120 is retained in the capacitor Cs through the write transistor Tr2. In other words, the drive transistor Tr1 is controlled to be on/off according to the signal retained by the capacitor Cs, and thereby, a driving current Ids is fed into each of the organic EL devices 10, which results in electron-hole recombination, causing emission of light. This light is extracted after passing through the protective film 12, the adhesion layer 13, the color filter 20, and the sealing substrate 14 (top emission).

Here, the light produced in each of the organic EL devices 10 is extracted after passing through the transmission color region 21 facing the organic EL device 10, but a part of the produced light enters the adjacent transmission color region 21. Here, since the semi-transmissive region 22 is provided at the part of the transmission color region 21, the part of the light entering the adjacent transmission color region 21 passes through the semi-transmissive region 22. Therefore, a phase difference occurs between light h1 passing through the adjacent transmission color region 21 and light h2 passing through the adjacent transmission color region 21 as well as the semi-transmissive region 22, which cancel out each other. This reduces color mixture caused by diffraction of the light h1 and h2 passing through the adjacent transmission color region 21.

In particular, in the second example illustrated in FIG. 4, the semi-transmissive region 22 is configured by using the semi-transmissive film 22A provided at the surface of the colored layer of the transmission color region 21, on the side close to the organic EL device 10 (i.e., the surface on the substrate 11 side). Therefore, the distance between the semi-transmissive region 22 and the organic EL device 10 is small, and even when the incident angle of the light h1 and that of the light h2 are equal, the quantity of the light h2 passing through both the transmission color region 21 and the semi-transmissive region 22 increases. Therefore, an effect of suppressing the color mixture caused by the diffraction of the light h1 and h2 is enhanced.

Further, in particular, in the third example illustrated in FIG. 5 or FIG. 6, the semi-transmissive region 22 has the first semi-transmissive film 22B provided at the surface of the colored layer of the transmission color region 21, on the side away from the organic EL device 10 (i.e., the surface on the sealing substrate 14 side), and the second semi-transmissive film 22C covering the surfaces (the underside and sides) of the first semi-transmissive film 22B. The second semi-transmissive film 22C has the protruding part 22D at the surface of the colored layer around the first semi-transmissive film 22B. Therefore, a phase difference may be caused between light h3 and light h4 of the light h2 passing through both the transmission color region 21 and the semi-transmissive region 22, the light h3 passing through a part where the first semi-transmissive film 22B and the second transmission film 22C overlap each other, and the light h4 passing through the protruding part 22D. Therefore, the phase difference may be caused between the light h1 passing through only the transmission color region 21 and the light h2 passing through both the transmission color region 21 and the semi-transmissive region 22, and simultaneously, the phase difference may be caused between the light h3 and the light h4. Accordingly, it is possible to further suppress the color mixture caused by the diffraction of the light h1 to h4.

Furthermore, in particular, in the fourth example illustrated in FIG. 7 or FIG. 8, the semi-transmissive region 22 has the semi-transmissive film 22E provided at the surface of the colored layer of the transmission color region 21, on the side away from the organic EL device 10 (i.e., the surface on the sealing substrate 14 side), and the shielding film 22F provided on the part of the surface (the underside) of the semi-transmissive film 22E. The semi-transmissive film 22E has the protruding part 22G at the surface of the colored layer around the shielding film 22F. Therefore, the color mixture caused by the diffraction of the light h1 and h2 may be suppressed with the protruding part 22G of the semi-transmissive film 22E, and also, it is possible to obtain an original effect of a black matrix, which is to improve contrast, by absorbing external light with the shielding film 22F.

In addition, in particular, in the fifth example illustrated in FIG. 9 or FIG. 10, the semi-transmissive region 22 including the first semi-transmissive film 22B and the second semi-transmissive film 22C is provided at the surface of the colored layer of the transmission color region 21, on the side close to the organic EL device 10 (i.e., the surface on the substrate 11 side). Further, in the sixth example illustrated in FIG. 11 or FIG. 12, the semi-transmissive region 22 including the semi-transmissive film 22E and the shielding film 22F is provided at the surface of the colored layer of the transmission color region 21, on the side close to the organic EL device 10 (i.e., the surface on the substrate 11 side). Therefore, the distance between the semi-transmissive region 22 and the organic EL device 10 is small and thus, even when the incident angle of the light h1 and that of the light h2 are equal, the quantity of the light h2 passing through both the transmission color region 21 and the semi-transmissive region 22 increases. Accordingly, it is possible to enhance an effect of suppressing the color mixture caused by the diffraction of the light h1 and h2.

Figure 13:
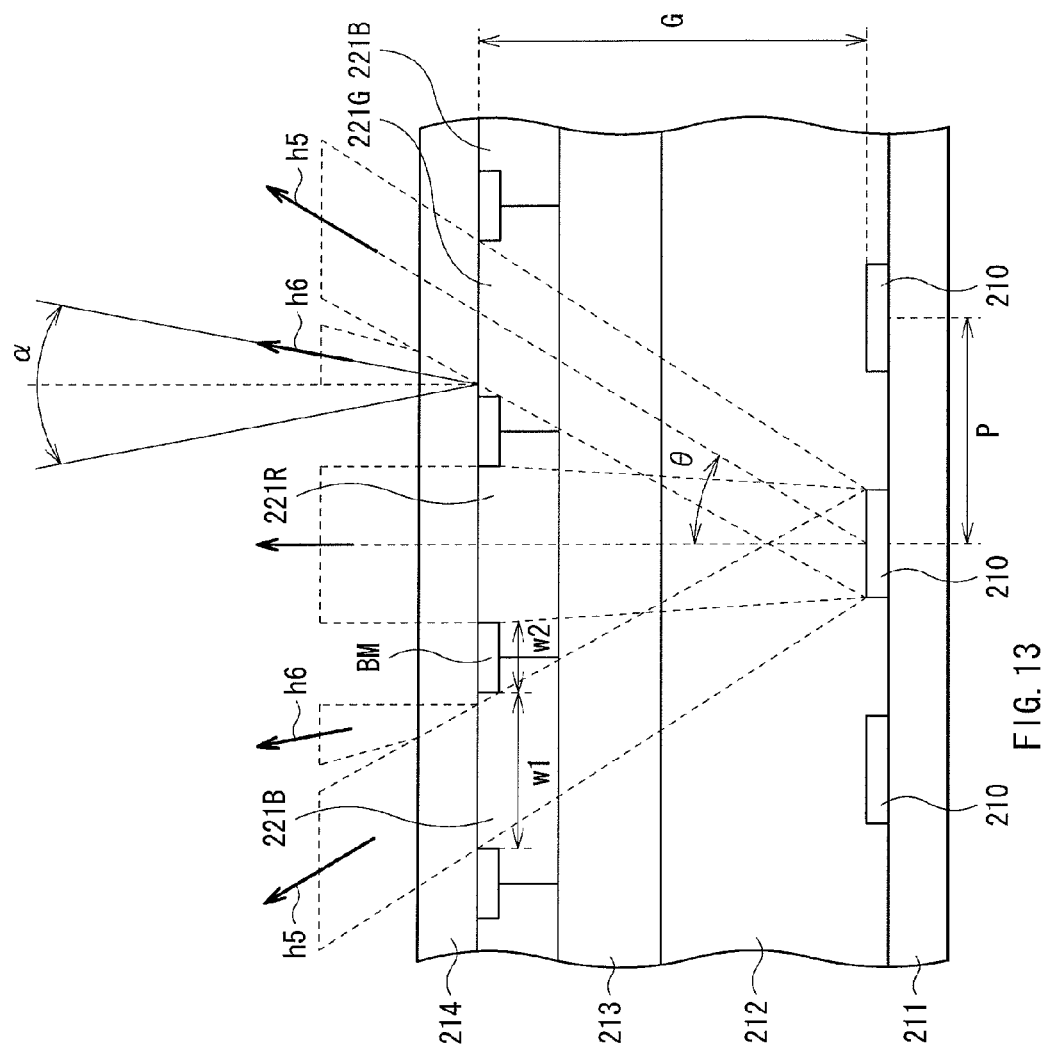
FIG. 13 is a diagram to explain a principle of color mixture caused by diffraction.

FIG. 13 illustrates a cross-sectional configuration of a display having an existing black matrix BM in place of the semi-transmissive region 22. The black matrix BM has a thickness of 200 nm and a line width w2 of 1.2 µm, and is made of titanium (Ti). It is to be noted that in FIG. 13, the same elements as those in FIG. 3 are provided with the same numbers in the two hundreds as those in FIG. 3.

In FIG. 13, for example, light produced in a middle organic EL device 210 is extracted after passing through a transmission color region 221 (a transmission red region 221R) facing the organic EL device 210, but a part of the produced light enters an adjacent transmission color region 221 (a transmission green region 221G or a transmission blue region 221B), resulting in transmitted light h5, and primary diffracted light h6 due to the black matrix BM.

FIG. 14 illustrates a simulation result obtained by examining the intensity of light passing through the adjacent transmission color region 221 (the transmission green region 221G), for the display having the existing black matrix BM illustrated in FIG. 13. It is to be noted that in FIG. 14, an angle is a value in the air. As apparent from FIG. 14, the light passing through the adjacent transmission color region 221 has a maximum peak at a viewing angle θ of around 32 degrees. This is equivalent to the transmitted light h5 illustrated in FIG. 13. Further, there is a second peak at a viewing angle of around 10 degrees, and this is equivalent to the primary diffracted light h6 illustrated in FIG. 13. Furthermore, there are a third peak and a fourth peak at viewing angles of around −5 degrees and around −20 degrees, respectively. These are equivalent to a secondary diffracted light and a tertiary diffracted light (not illustrated in FIG. 13).

On the other hand, the acceptance angle α of the eyepiece (not illustrated) mentioned above is, for example, −10 degrees to +10 degrees both inclusive. Therefore, as illustrated in FIG. 13 and FIG. 14, the transmitted light h5 does not enter in the range of −10 degrees to +10 degrees both inclusive, but the primary diffracted light h6 and the secondary diffracted light (see FIG. 14) enter in the range of −10 degrees to +10 degrees both inclusive, causing color mixture.

FIG. 15 illustrates simulation results obtained by producing displays having the semi-transmissive region 22 in each of the first to fourth examples illustrated in FIG. 3, FIG. 4, FIG. 5, and FIG. 7, and examining a color mixing rate in the range of the eyepiece (±10 degrees), for the produced displays. It is to be noted that the color mixing rates of FIG. 15 are represented using a color mixing rate of the display provided with the existing black matrix BM illustrated in FIG. 13 as a reference value. As illustrated in FIG. 15, the color mixing rate is −48% in the first example, −63% in the second example, −66% in the third example, and −44% in the fourth example, in any of which the color mixing rate is greatly suppressed as compared to the case having the existing black matrix BM (a comparative example).

When the first example and the second example are compared to each other, the color mixing rate in the second example is suppressed further than that in the first example. It is conceivable that this may be because, in the second example, the distance between the semi-transmissive region 22 and the organic EL device 10 has become small, and even when the incidence angle of the light h1 and that of the light h2 are equal, the quantity of the light h2 passing through both the transmission color region 21 and the semi-transmissive region 22 has increased.

Further, when the first example and the third example are compared to each other, the color mixing rate in the third example is suppressed further than that in the first example. It is conceivable that this may be because, in the third example, the phase difference may be caused between the light h3 passing through the part where the first semi-transmissive film 22B and the second transmission film 22C overlap each other, and the light h4 passing through the protruding part 22D, of the light h2 passing through both the transmission color region 21 and the semi-transmissive region 22.

Figure 16:
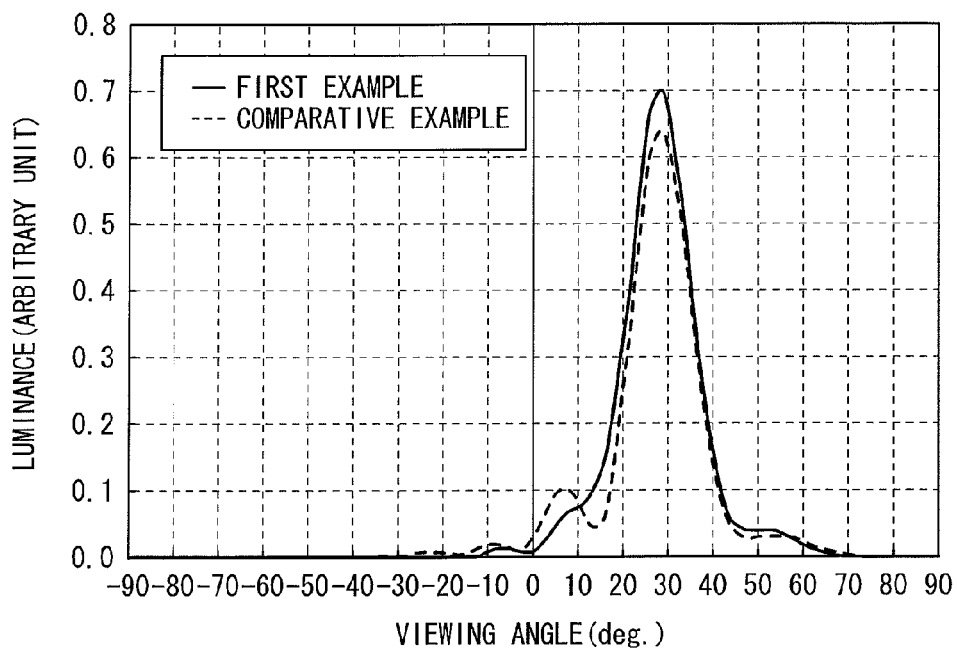
FIG. 16 is a diagram illustrating luminance of light passing through an adjacent transmission color region in a case where the semi-transmissive region of the first example is provided, in comparison with the case in which the existing black matrix illustrated in FIG. 13 is provided.
Figure 17:
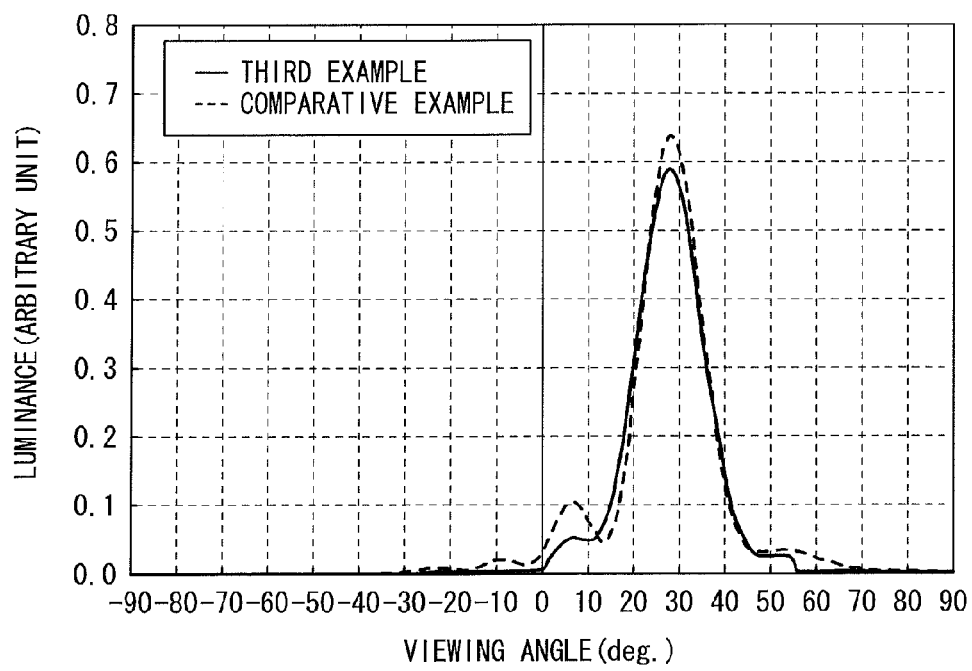
FIG. 17 is a diagram illustrating luminance of light passing through an adjacent transmission color region in a case where the semi-transmissive region of the third example is provided, in comparison with the case in which the existing black matrix illustrated in FIG. 13 is provided.

FIG. 16 and FIG. 17 illustrate results obtained by examining the intensity of light passing through the adjacent transmission color region 21 in the first example and the third example, respectively. It is to be noted that the case having the existing black matrix BM illustrated in FIG. 14 is also illustrated in each of FIG. 16 and FIG. 17, as a comparative example. As seen in FIG. 16 and FIG. 17, in either of the first example and the third example, the primary diffracted light and the secondary diffracted light within the range of the acceptance angle α of the eyepiece (−10 degrees to +10 degrees) are both suppressed as compared to the comparative example. In addition, it is apparent that the intensity of the diffracted light in the third example is suppressed further than that in the first example.

Furthermore, when the first example and the fourth example are compared to each other in FIG. 15, the color mixing rate in the fourth example is approximately the same as that in the first example. It is conceivable that this may be because an effect of reflection in the shielding film 22F made of titanium is present in the fourth example.

Figure 18:
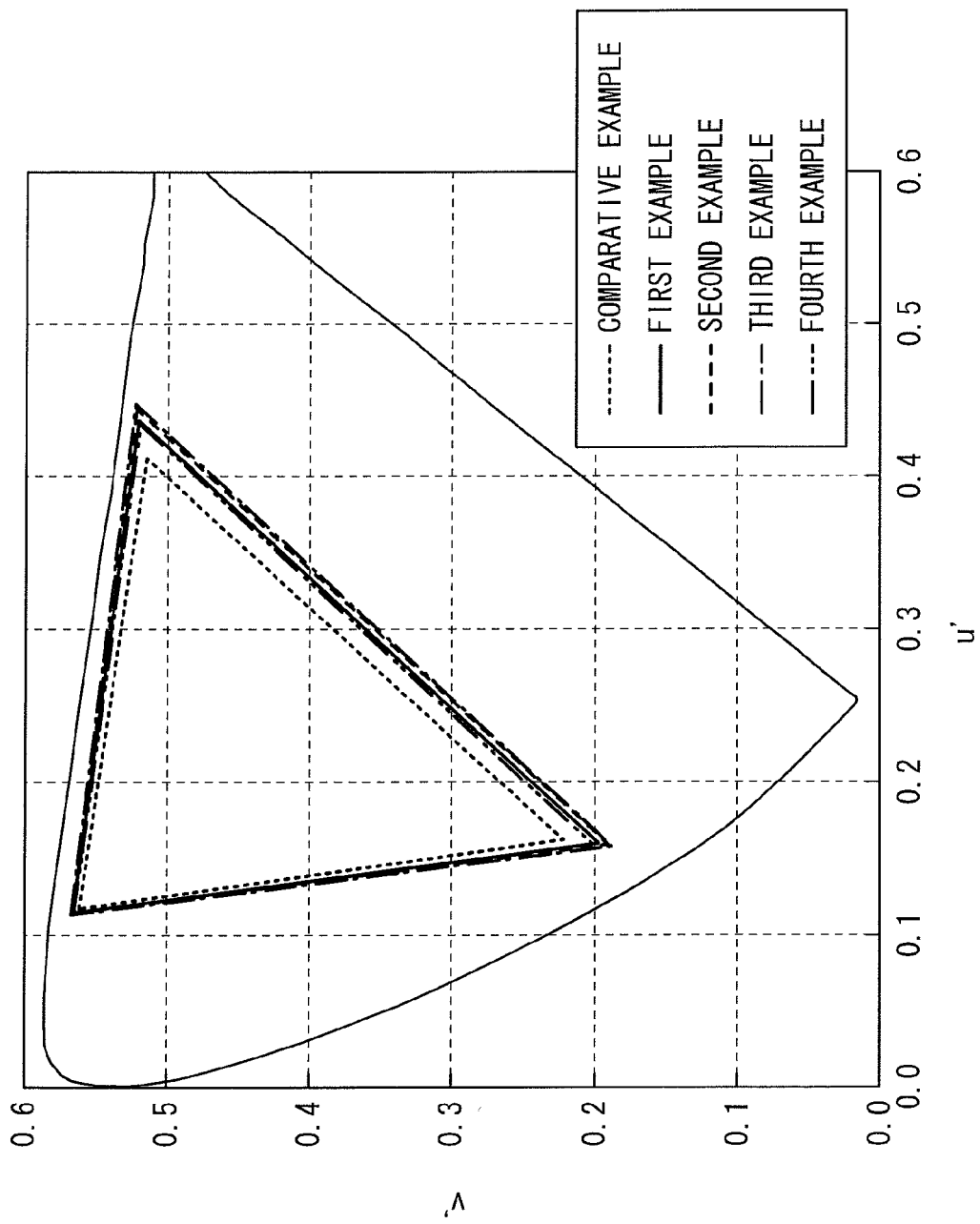
FIG. 18 is a diagram illustrating a color reproduction range in a case where the semi-transmissive region of each of the first example to the fourth example is provided, in comparison with the case in which the existing black matrix illustrated in FIG. 13 is provided.

FIG. 18 is a chromaticity diagram (CIE1976 u'v' chromaticity diagram) in which a color reproduction range of the semi-transmissive region 22 in each of the first example to the fourth example illustrated in FIG. 3, FIG. 4, FIG. 5, and FIG. 7 is illustrated, in comparison with the comparative example provided with the existing black matrix BM illustrated in FIG. 13. As seen in FIG. 18, in any of the first example to the fourth example, the color reproduction range in terms of red and blue in particular is increased as compared to the comparative example.

In other words, it has been found that providing the semi-transmissive region 22 at a part of the transmission color region 21 makes it possible to suppress color mixture caused by the diffraction of the light to passing through the adjacent transmission color region 21, improve color purity, and increase the color reproduction range.

Figure 19:
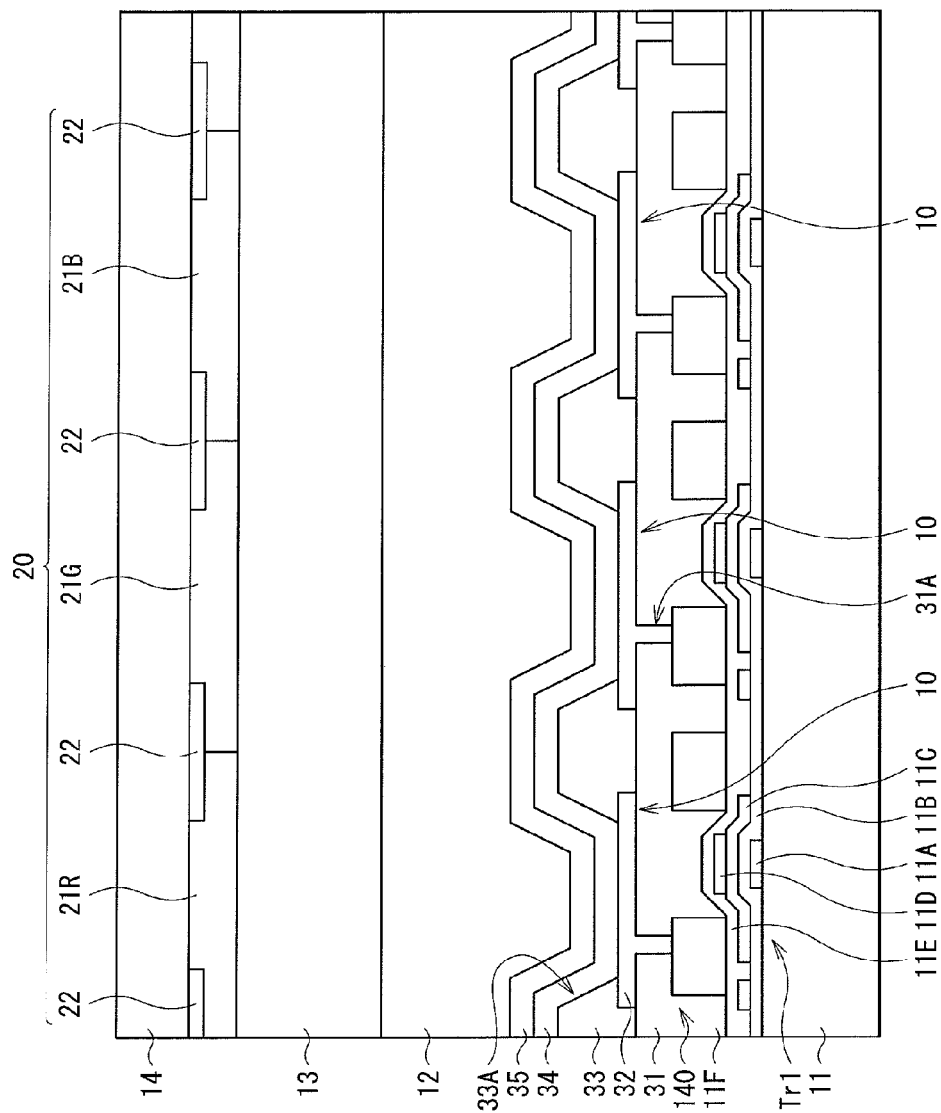
FIG. 19 is a cross-sectional diagram illustrating a configuration of a light emitting element illustrated in FIG. 3.

FIG. 19 illustrates a specific configuration of the organic EL device 10 illustrated in FIG. 3. On the substrate 11, the pixel driving circuit 140 having the drive transistor Tr1 described above is provided. The surface of the substrate 11, on which the pixel driving circuit 140 is provided, is covered by a first insulating film 31. The organic EL device 10 is provided on the first insulating film 31.

The drive transistor Tr1 has, for example, a bottom-gate (inverted staggered) configuration in which a gate electrode 11A, a gate insulating film 11B, a semiconductor film 11C, a channel protective film 11D, an interlayer insulating film 11E, and a wiring 11F are sequentially laminated in this order on the substrate 11. It is to be noted that the write transistor Tr2 illustrated in FIG. 2 has a configuration similar to that of the drive transistor Tr1.

The first insulating film 31 is provided to flatten the surface of the substrate 11 on which the pixel driving circuit 140 is formed, and the first insulating film 31, for example, has a thickness of 100 nm to 1,000 nm both inclusive, and is made of silicon oxynitride (SiON) or silicon oxide ($SiO_2$ or SiO). Further, the first insulating film 31 may have a thickness of around 2.0 μm, and be made of a photosensitive insulating material such as polyimide. The first insulating film 31 has a connection hole 31A to establish electric connection between the drive transistor Tr1 and the organic EL device 10.

The organic EL device 10 is provided on the first insulating film 31, and has a configuration in which the first electrode 32, a second insulating film 33, an organic layer 34 including a light emitting layer, and the second electrode 35 are laminated in this order from the substrate 11 side.

The first electrode 32 is provided for each of the organic EL devices 10. The first electrode 32, for example, has a thickness of around 100 nm, and is made of aluminum (Al) which is a high reflectance material, or an alloy including aluminum (Al), and extracts light produced in the light emitting layer from the second electrode 35 side (top emission). It is desirable that the thickness of the first electrode 32 be in a range in which the light produced in the light emitting layer is not allowed to pass therethrough and light extraction efficiency may be maintained, i.e. in a rage of 30 nm to 200 nm, for example. As a material of the first electrode 32, besides aluminum (Al) or an alloy thereof, there is a reflecting electrode made of a simple substance or an alloy of a metallic element such as gold (Au), platinum (Pt), nickel (Ni), chromium (Cr), copper (Cu), tungsten (W), molybdenum (Mo), titanium (Ti), tantalum (Ta), or silver (Ag).

Further, the first electrode 32 may have an adhesion layer (not illustrated) which has a thickness of around 20 nm and is made of titanium (Ti), tungsten (W), copper (Cu), tantalum (Ta), molybdenum (Mo), or the like, as a base of the reflecting electrode. This adhesion layer also has a function of serving as a reflection assistance layer to maintain a reflectance at a high level even when the thickness of the first electrode 32 is reduced. In a case where such an adhesion layer is provided, a 15 nm or more of thickness is sufficient for the thickness of the first electrode 32.

Furthermore, the first electrode 32 may have a three-layer structure including a titanium layer serving as the adhesion layer or the reflection assistance layer, the above-described reflecting electrode made of aluminum or an alloy thereof, and a titanium layer or a tantalum layer. Alternatively, the first electrode 32 may be configured using a composite film including the above-described reflecting electrode, and a transparent electrode made of ITO (Indium Tin Oxide), IZO (registered trademark) (Indium Zinc Oxide), $SnO_2$, or the like.

The second insulating film 33 is provided to secure insulation between the first electrode 32 and the second electrode 35, and precisely make a light-emitting region have a desired shape. The second insulating film 33 has an aperture 33A corresponding to the light-emitting region of the first electrode 32. The second insulating film 33, for example, has a thickness of 100 nm to 200 nm, and is made of SiON. Further, the second insulating film 33 may be made of a photosensitive insulating material such as polyimide.

The organic layer 34 is provided on the first electrode 32 and the second insulating film 33, as being common to the organic EL devices 10. The organic layer 34 has, for example, a configuration in which a hole injection layer, a hole transport layer, the light emitting layer, and an electron transport layer are sequentially laminated from the first electrode 32 side.

The hole injection layer is provided to increase hole injection efficiency, and is also a buffer layer to prevent leakage. The hole injection layer, for example, has a thickness of 2 nm to 10 nm both inclusive, and is made of hexatolyl azatriphenylene expressed by a chemical formula (1).

Chemical formula (1)

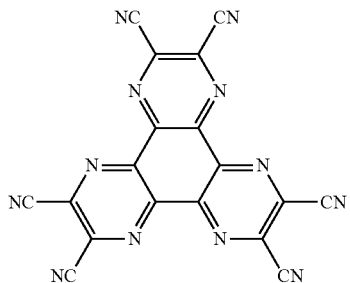

The hole transport layer is provided to increase the hole injection efficiency for the light emitting layer. The hole transport layer, for example, has a thickness of 30 nm, and is made of a material expressed by a chemical formula (2).

Chemical formula (2)

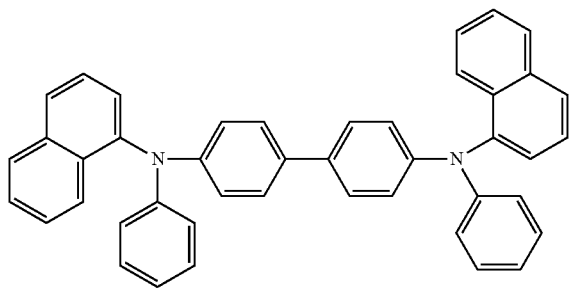

The light emitting layer is, for example, a layer for white-light emission in which a red light emitting layer having a thickness of 10 nm, a light-emission separation layer having a thickness of 10 nm, a blue light emitting layer having a thickness of 10 nm, and a green light emitting layer having a thickness of 10 nm (none of which is illustrated) are sequentially laminated from the first electrode 32 side. The red light emitting layer produces red light, through recombination of a part of holes injected from the first electrode 32 via the hole injection layer and the hole transport layer, and a part of electrons injected from the second electrode 35 via the electron transport layer, which occurs by application of an electric field. The light-emission separation layer is provided to reduce an amount of electrons supplied to the red light emitting layer. The blue light emitting layer produces blue light, through recombination of a part of holes injected from the first electrode 32 via the hole injection layer, the hole transport layer, and the light-emission separation layer, and a part of electrons injected from the second electrode 35 via the electron transport layer, which occurs by application of an electric field. The green light emitting layer produces green light, through recombination of a part of holes injected from the first electrode 32 via the hole injection layer, the hole transport layer, and the light-emission separation layer, and a part of electrons injected from the second electrode 35 via the electron transport layer, which occurs by application of an electric field. The red light emitting layer, the green light emitting layer, and the blue light emitting layer are each configured to emit the light in a region corresponding to the aperture 33A of the second insulating film 33.

The red light emitting layer includes, for example, one or more kinds of a red light emitting material, a hole-transporting material, an electron-transporting material, and a both-carrier transporting material. The red light emitting material may be fluorescent or phosphorescent. Specifically, the red light emitting layer, for example, has a thickness of around 5 nm, and is made of 4,4-bis(2,2-diphenylvinyl)biphenyl (DPVBi), mixed with 30 wt % of 2,6-bis[(4'-methoxydiphenylamino)styryl]-1,5-dicyano naphthalene (BSN).

The light-emission separation layer is made of, for example, a material expressed by a chemical formula (3).

Chemical formula (3)

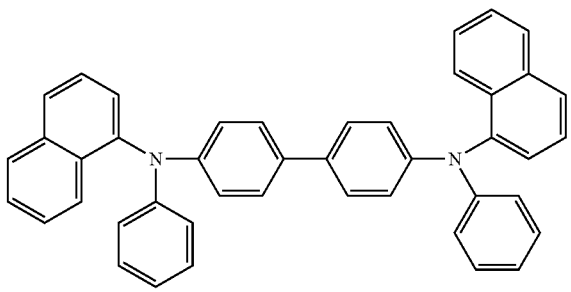

The green light emitting layer includes, for example, one or more kinds of a green light emitting material, a hole-transporting material, an electron-transporting material, and a both-carrier transporting material. The green light emitting material may be fluorescent or phosphorescent. Specifically, the green light emitting layer, for example, has a thickness of around 10 nm, and is made of DPVBi mixed with 5 wt % of coumarin 6.

The blue light emitting layer includes, for example, one or more kinds of a blue light emitting material, a hole-transporting material, an electron-transporting material, and a both-carrier transporting material. The blue light emitting material may be fluorescent or phosphorescent. Specifically, the blue light emitting layer, for example, has a thickness of around 30 nm, and is made of DPVBi mixed with 2.5 wt % of 4,4'-bis[2-{4-(N,N-diphenylamino)phenyl}vinyl]biphenyl (DPAVBi).

The electron transport layer is provided to increase electron injection efficiency for the light emitting layer. The electron transport layer, for example, has a thickness of around 20 nm, and is made of 8-hydroxyquinoline aluminum (Alq3).

The second electrode 35 is provided on the organic layer 34, as being common to the organic EL devices 10. The second electrode 35 has, for example, a configuration in which a first layer having a thickness of approximately 0.3 nm and made of lithium fluoride (LiF), a second layer having a thickness of 3 nm and made of calcium (Ca), and a third layer having a thickness of 5 nm and made of a Mg—Ag alloy are sequentially laminated from the first electrode 32 side. The second electrode 35 is connected to an auxiliary wiring (not illustrated) in a region outside the display region 110. The reason is that since the organic layer 34 is provided as being common to the organic EL devices 10, it is difficult to establish connection between the second electrode 35 and the auxiliary wiring for every one of the organic EL devices 10.

This display may be produced as follows, for example.

First, the pixel driving circuit 140 is formed on the substrate 11 made of the above-mentioned material, and the first insulating film 31 having the connection hole 31A is formed.

Next, for instance, a titanium film and an aluminum alloy film (not illustrated) is formed on the first insulating film 31 by sputtering, for example. Subsequently, these titanium film and aluminum alloy film are mold into a predetermined shape by, for example, photolithography and dry etching, and thereby the first electrode 32 is formed for every one of the organic EL devices 10.

Subsequently, a SiON film is formed to have, for example, a thickness of 10 nm to 200 nm both inclusive, on the first electrode 32 and the first insulating film 31 by, for example PECVD. This SiON film is molded into a predetermined shape by, for example, photolithography and dry etching, and thereby the second insulating film 33 having the aperture 33A is formed.

Subsequently, the organic layer 34 is formed on the first electrode 32 and the second insulating film 33 by, for example, vapor deposition, and then, the second electrode 35 is formed by, for example, vacuum deposition. The organic EL devices 10 illustrated in FIG. 3 and FIG. 19 are thus formed.

Next, as illustrated in FIG. 3, the protective film 12 made of the above-mentioned material is formed on the organic EL devices 10 by, for example, CVD or sputtering.

Further, for example, the sealing substrate 14 made of the above-mentioned material is prepared, and the color filter 20 with the semi-transmissive region 22 having the configuration of any of the first example to the sixth example illustrated in FIG. 3 to FIG. 12 is formed at the sealing substrate 14.

In a case in which the color filter 20 having the semi-transmissive region 22 of the first example illustrated in FIG. 3 is produced, at first, a titanium nitride film having a thickness of 90 nm is formed on the sealing substrate 14. Subsequently, the titanium nitride film is subjected to photoresist patterning and wet etching, and thereby the semi-transmissive region 22 with the semi-transmissive film 22A having a line width of 1.2 µm and made of titanium nitride is formed.

Subsequently, the sealing substrate 14 where the semi-transmissive film 22A is formed is coated with the material of the colored layer of the transmission red region 21R by spin coating or the like, and fired after patterned by a photolithography technique, and thereby the transmission red region 21R is formed. Subsequently, in a manner similar to the transmission red region 21R, the transmission blue region 21B and the transmission green region 21G are sequentially formed, and thereby the transmission color region 21 having the transmission red region 21R, the transmission green region 21G, and the transmission blue region 21B is formed.

In a case where the color filter 20 having the semi-transmissive region 22 of the second example illustrated in FIG. 4 is formed, at first, the transmission color region 21 having the transmission red region 21R, the transmission green region 21G, and the transmission blue region 21B is formed on the sealing substrate 14 in a manner similar to the first example.

Subsequently, in a manner similar to the first example, the semi-transmissive region 22 with the semi-transmissive film 22A having a thickness of 90 nm and a line width of 1.2 µm, and made of titanium nitride is formed on the transmission color region 21. Alternatively, the semi-transmissive region 22 with the semi-transmissive film 22A having a thickness of 90 nm and a line width of 1.2 µm, and made of black resin is formed on the transmission color region 21.

In a case where the color filter 20 having the semi-transmissive region 22 of the third example illustrated in FIG. 5 is formed, at first, the first semi-transmissive film 22B having a thickness of 90 nm and a line width of 1.2 µm, and made of titanium nitride is formed on the sealing substrate 14, in a manner similar to the first example.

Subsequently, after a titanium nitride film having a thickness of 30 nm is formed on the sealing substrate 14 where the first semi-transmissive film 22B is formed, this titanium nitride film is subjected to photoresist patterning and wet etching, and thereby the second semi-transmissive film 22C having a line width of 1.8 µm is formed. The protruding amount d1 of the protruding part 22D is 0.3 µm on one side of the transmission color region 21, and 0.6 µm on both sides in total. The semi-transmissive region 22 having the first semi-transmissive film 22B and the second semi-transmissive film 22C is thus formed.

Subsequently, in a manner similar to the first example, the transmission color region 21 having the transmission red region 21R, the transmission green region 21G, and the transmission blue region 21B is formed.

In a case where the color filter 20 having the semi-transmissive region 22 of the fourth example illustrated in FIG. 7 is formed, a titanium nitride film having a thickness of 30 nm is formed and then, this titanium nitride film is subjected to photoresist patterning and wet etching, and thereby the semi-transmissive film 22E having a line width of 1.8 µm is formed.

Next, a titanium film having a thickness of 200 nm is formed on the sealing substrate 14 where the semi-transmissive film 22E is formed. This titanium film is then subjected to photoresist patterning and wet etching to have the same line width of 1.8 µm as that of the semi-transmissive film 22E. There is a difference in etching selectivity between titanium nitride and titanium, and an etching rate of titanium is high and thus, it is possible to form the shielding film 22F having a line width of 1.2 µm on the surface of the semi-transmissive film 22E, while maintaining a line width w4 of the semi-transmissive film 22E. The protruding amount d1 of the protruding part 22G is 0.3 µm on one side of the transmission color region 21, and 0.6 µm on both sides in total. The semi-transmissive region 22 having the semi-transmissive film 22E and the shielding film 22F is thus formed.

Subsequently, in a manner similar to the first example, the transmission color region 21 having the transmission red region 21R, the transmission green region 21G, and the transmission blue region 21B is formed.

In a case where the color filter 20 having the semi-transmissive region 22 of the fourth example illustrated in FIG. 8 is formed, a titanium film having a thickness of 200 nm is formed and then, this titanium film is subjected to photoresist patterning and wet etching, and thereby the shielding film 22F having a line width of 1.2 µm is formed.

Subsequently, a titanium nitride film having a thickness of 30 nm is formed on the sealing substrate 14 where the shielding film 22F is formed. This titanium nitride film is subjected to photoresist patterning and wet etching, and thereby the semi-transmissive film 22E having a line width of 1.8 µm is formed on the surface of the shielding film 22F. The protruding amount d1 of the protruding part 22G is 0.3 µm on one side of the transmission color region 21, and 0.6 µm on both sides in total. The semi-transmissive region 22 having the semi-transmissive film 22E and the shielding film 22F is thus formed.

Subsequently, in a manner similar to the first example, the transmission color region 21 having the transmission red region 21R, the transmission green region 21G, and the transmission blue region 21B is formed.

In a case where the color filter 20 having the semi-transmissive region 22 of the fifth example illustrated in FIG. 9 or FIG. 10 is formed, at first, the transmission color region 21 having the transmission red region 21R, the transmission green region 21G, and the transmission blue region 21B is formed in a manner similar to the first example. Subsequently, the semi-transmissive region 22 having the first semi-transmissive film 22B and the second semi-transmissive film 22C is formed in a manner similar to the third example.

In a case where the color filter 20 having the semi-transmissive region 22 of the sixth example illustrated in FIG. 11 or FIG. 12 is formed, at first, the transmission color region 21 having the transmission red region 21R, the transmission green region 21G, and the transmission blue region 21B is formed in a manner similar to the first example. Subsequently, the semi-transmissive region 22 having the semi-transmissive film 22E and the shielding film 22F is formed in a manner similar to the fourth example.

After the color filter 20 is formed on the sealing substrate 14, the adhesion layer 13 is formed on the protective film 12 as illustrated in FIG. 3 likewise, and the sealing substrate 14 is adhered with the adhesion layer 13 in between. This completes the display illustrated in FIG. 1 to FIG. 3.

As described above, in the present embodiment, the semi-transmissive region 22 is provided at a part of the transmission color region 21 of the color filter 20 and thus, it is possible to suppress the color mixture caused by the diffraction of the light h1 and light h2 passing through the adjacent transmission color region 21 of the color filter 20 even when the size of the organic EL device 10 is small.

MODULE AND APPLICATION EXAMPLES

Application examples of the display in the foregoing embodiment will be described below. The display in the embodiment is applicable to electronic devices in all fields, which display externally-input image signals or internally-generated image signals as still or moving images, such as television receivers, digital cameras, laptop computers, portable terminal devices such as portable telephones, and video cameras.

(Module)

Figure 20:
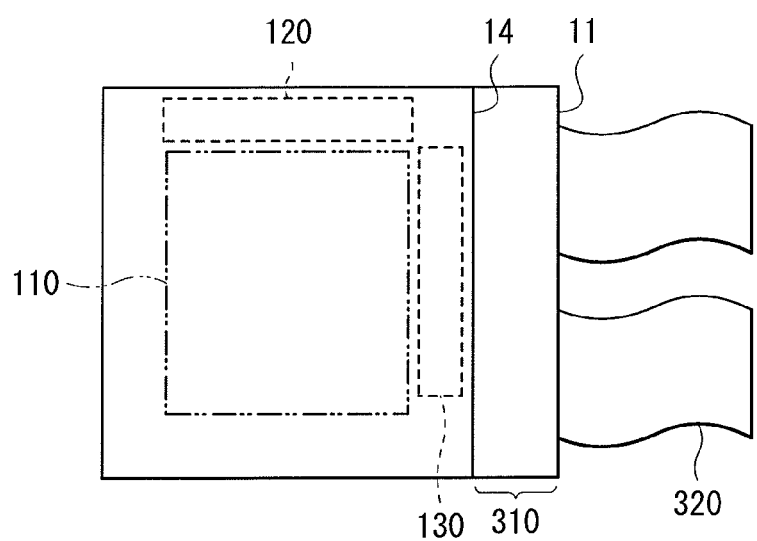
FIG. 20 is a plan view illustrating a schematic configuration of a module including the display of the embodiment.

The display in the embodiment is incorporated into an electronic device such as the application examples 1 and 2 to be described below, as a module as illustrated in FIG. 20, for example. This module is formed, for example, by providing a region 310 exposed at one side of the substrate 11 from the sealing substrate 14, and forming an external connection terminal (not illustrated) by extending wirings of the signal-line driving circuit 120 and the scanning-line driving circuit 130 to the exposed region 310. The external connection terminal may be provided with a flexible printed circuit board (FPC) 320 for input and output of signals.

Application Example 1

Figure 21A:
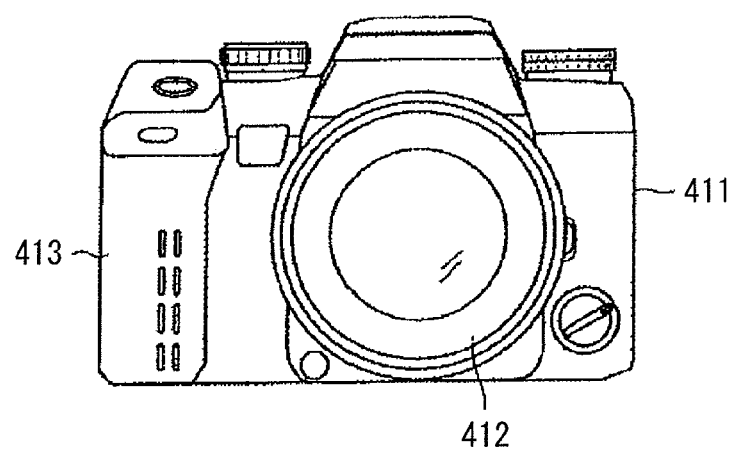
FIGS. 21A and 21B are a front view and a rear view, respectively, each illustrating an appearance of an application example 1 of the display according to the embodiment.
Figure 21B:
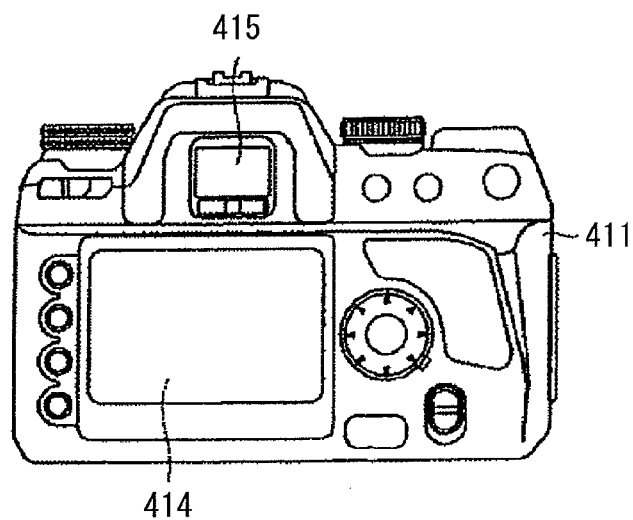

FIGS. 21A and 21B each illustrate an appearance of an image pickup device (a single-lens reflex digital camera with an interchangeable lens) to which the display of the embodiment is applied. This image pickup device has, for example, an interchangeable image-taking lens unit (interchangeable lens) 412 and a grip section 413 to be held by a photographer, on a front face of a camera main section (camera body) 411. The image-taking lens unit 412 is on the right side, and the grip section 413 is on the left side, when viewed from front. A monitor 414 is provided at an approximately center of a back face of the camera main section 411. Above the monitor 414, a view finder (eyepiece window) 415 is provided. It is possible for the photographer to visually recognize an optical image of a subject led from the image-taking lens unit 412 and determine composition, through the view finder 415. This view finder 415 is configured using the display according to the embodiment.

Application Example 2

Figure 22:
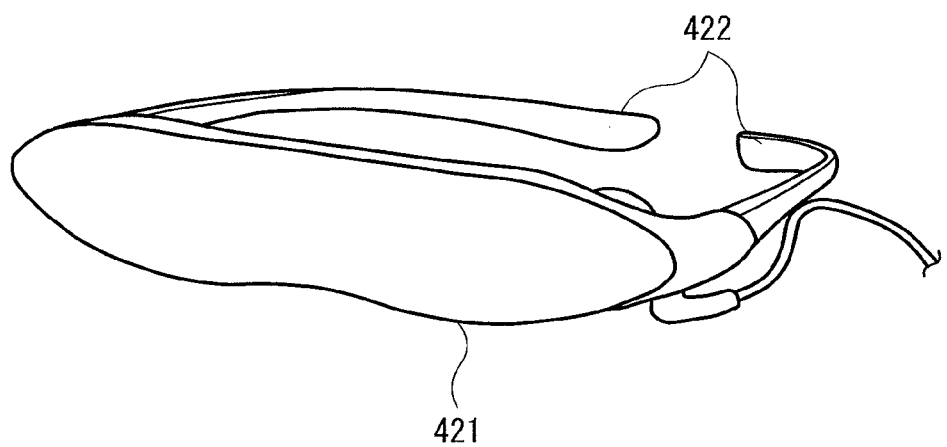
FIG. 22 is a perspective diagram illustrating an appearance of an application example 2.

FIG. 22 illustrates an appearance of a head mount display to which the display of the embodiment is applied. This head mount display has, for example, ear-hung sections 422 provided on both sides of a display section 421 shaped like glasses. The ear-hung sections 422 are used to place the head mount display on the head of a user. The display section 421 is configured using the display according to the embodiment.

The present technology has been described by using the embodiment, but is not limited to the embodiment, and may be variously modified. For example, the embodiment has been described for the case where the semi-transmissive region 22 is provided to face the border between the plurality of organic EL devices 10. However, the position of the semi-transmissive region 22 is not limited in particular, as long as the semi-transmissive region 22 is provided at a position where a part of light that enters from one of the organic EL devices 10 into the transmission color region 21 facing the organic EL device 10 adjacent to this organic EL device 10 may pass through the semi-transmissive region 22. For example, the semi-transmissive region 22 may be disposed at a center of the transmission color region 21 (a center of the transmission red region 21R, a center of the transmission green region 21G, and a center of the transmission blue region 21B).

Further, for example, the embodiment has been described for the case in which the transmission color region 21 has the colored layer of the three different colors of the transmission red region 21R, the transmission green region 21G, and the transmission blue region 21B. However, the transmission color region 21 may have a colored layer of two different colors, or four or more different colors. Examples of the case of two colors include use of blue and yellow. Further, examples of the case of four colors include use of red, green, blue, with yellow, cyan, or magenta.

Furthermore, for example, the embodiment has been described for the case where the color filter 20 is provided on the sealing substrate 14, but the color filter 20 may be provided, for example, between the protective film 12 and the adhesion layer 13, on the substrate 11.

In addition, for example, the embodiment has been described by taking the case where the light produced in the light emitting layer is extracted from the sealing substrate 14 side (top emission) as an example, but the light produced in the light emitting layer may be extracted from the substrate 11 side (bottom emission). In this case, it is possible to provide the color filter 20, for example, between the pixel driving circuit 140 and the first insulating film 31, on the substrate 11. Further, in the case of the bottom emission, the first electrode 32 is configured by using a transparent electrode made of ITO, IZO (registered trademark), $SnO_2$, or the like, and the second electrode 35 is configured by using a reflecting electrode made of a simple substance or an alloy of a metallic element such as gold (Au), platinum (Pt), nickel (Ni), chromium (Cr), copper (Cu), tungsten (W), aluminum (Al), molybdenum (Mo), or silver (Ag). Furthermore, the second electrode 35 may be made of a composite film including the reflecting electrode and the transparent electrode described above.

Furthermore, for example, the material and thickness, the film formation method and film formation condition, or the like of each layer in the embodiment is not limited, and other material and thickness or other film formation method and film formation condition may be employed. For example, the embodiment has been described for the case where the semi-transmissive films 22A and 22E, the first semi-transmissive film 22B, and the second semi-transmissive film 22C are made of titanium nitride, and the shielding film 22F is made of titanium. However, as the material of each layer of the semi-transmissive region 22, a material with a low reflectance and a high optical absorptance rate such as chromium nitride (CrN), chromium (Cr), or photosensitive black resin may be used, other than titanium nitride and titanium.

In addition, for example, the embodiment has been described for the case where the light emitting element is the organic EL device 10, but the display of the present disclosure may include other light emitting element such as an inorganic EL device.

It is possible to achieve at least the following configurations from the above-described example embodiment of the disclosure.

(1) A display including:
a plurality of light emitting elements; and
a color filter having a transmission color region facing the plurality of light emitting elements, and a semi-transmissive region provided at a part of the transmission color region.
(2) The display according to (1), wherein the semi-transmissive region is provided at a position where a part of light entering from one of the plurality of light emitting elements into the transmission color region facing the light emitting element adjacent to the one of the plurality of light emitting elements is allowed to pass through the semi-transmissive region.
(3) The display according to (2), wherein the semi-transmissive region is provided to face a border between the plurality of light emitting elements.
(4) The display according to any one of (1) to (3), wherein the transmission color region includes two or more colored layers of different colors, and
the semi-transmissive region includes a semi-transmissive film provided at a surface of the colored layer.
(5) The display according to (4), wherein the semi-transmissive film is provided at a surface of the colored layer, the surface being on a side away from the plurality of light emitting elements.
(6) The display according to (4), wherein the semi-transmissive film is provided at a surface of the colored layer, the surface being on a side close to the plurality of light emitting elements.
(7) The display according to any one of (1) to (3), wherein the transmission color region includes two or more colored layers of different colors, and
the semi-transmissive region includes:
a first semi-transmissive film; and
a second semi-transmissive film having a protruding part at a surface of the colored layer around the first semi-transmissive film.
(8) The display according to any one of (1) to (3), wherein the transmission color region includes two or more colored layers of different colors, and
the semi-transmissive region includes:
a shielding film; and
a semi-transmissive film having a protruding part at a surface of the colored layer around the shielding film.
(9) The display according to any one of (1) to (8), wherein the light emitting element is an organic electroluminescent element in which a first electrode, an organic layer including a light emitting layer, and a second electrode are laminated sequentially.
(10) The display according to (9), wherein the organic electroluminescent element emits white light, and
the colored layers include a red colored layer, a green colored layer, and a blue colored layer extracting the white light as red light, green light, or blue light.
(11) The display according to (9) or (10), wherein the plurality of organic electroluminescent elements have a rectangular shape long in one direction, and arranged in a row direction parallel to a shorter side and in a column direction parallel to a longer side, and
a pitch of the plurality of organic electroluminescent elements in the row direction is equal to or less than 30 μm.
(12) An electronic device including
a display including:
a plurality of light emitting elements; and
a color filter having a transmission color region facing the plurality of light emitting elements, and a semi-transmissive region provided at a part of the transmission color region.

The present disclosure contains subject matter related to that disclosed in Japanese Priority Patent Application JP 2011-075470 filed in the Japan Patent Office on Mar. 30, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A display comprising:
a plurality of light emitting elements; and
a color filter having a transmission color region facing the plurality of light emitting elements, and a semi-transmissive region provided at a part of the transmission color region, wherein the transmission color region includes two or more colored layers of different colors, and wherein
the semi-transmissive region includes:
a first semi-transmissive film; and
a second semi-transmissive film having a protruding part at a surface of the colored layer around the first semi-transmissive film.
2. The display according to claim 1, wherein the semi-transmissive region is provided to face a border between the plurality of light emitting elements.
3. The display according to claim 1, wherein
the first semi-transmissive film is provided at a surface of the colored layer.
4. The display according to claim 3, wherein the semi-transmissive film is provided at a surface of the colored layer, the surface being on a side away from the plurality of light emitting elements.

5. The display according to claim 3, wherein the semi-transmissive film is provided at a surface of the colored layer, the surface being on a side close to the plurality of light emitting elements.

6. The display according to claim 1, wherein the light emitting elements are organic electroluminescent elements in which a first electrode, an organic layer including a light emitting layer, and a second electrode are laminated sequentially.

7. The display according to claim 6, wherein the organic electroluminescent elements emit white light, and
the colored layers include a red colored layer, a green colored layer, and a blue colored layer extracting the white light as red light, green light, or blue light.

8. The display according to claim 6, wherein the plurality of organic electroluminescent elements have a rectangular shape long in one direction, and arranged in a row direction parallel to a shorter side and in a column direction parallel to a longer side, and a pitch of the plurality of organic electroluminescent elements in the row direction is equal to or less than 30 μm.

9. A display comprising:
a plurality of light emitting elements; and
a color filter having a transmission color region facing the plurality of light emitting elements, and a semi-transmissive region provided at a part of the transmission color region, wherein the transmission color region includes two or more colored layers of different colors, and wherein
the semi-transmissive region includes:
a shielding film; and
a semi-transmissive film having a protruding part at a surface of the colored layer around the shielding film.

10. The display according to claim 9, wherein the semi-transmissive region is provided to face a border between the plurality of light emitting elements.

11. The display according to claim 9, wherein the semi-transmissive film is provided at a surface of the colored layer.

12. The display according to claim 11, wherein the semi-transmissive film is provided at a surface of the colored layer, the surface being on a side away from the plurality of light emitting elements.

13. The display according to claim 11, wherein the semi-transmissive film is provided at a surface of the colored layer, the surface being on a side close to the plurality of light emitting elements.

14. An electronic device comprising:
a display including:
a plurality of light emitting elements; and
a colored filter having a transmission color region facing the plurality of light emitting elements, and a semi-transmissive region provided at a part of the transmission color region, wherein the semi-transmissive region is provided at a position where a part of light entering from at least one of the light emitting elements included in the plurality of light emitting elements into the transmission color region passes through the semi-transmissive region, wherein the transmission colors, region includes two or more colored layers of different colors, and
the semi-transmissive region includes:
a first semi-transmissive film; and
a second semi-transmissive film having a protruding part at a surface of the colored layer around the first semi-transmissive film.

15. The electronic device according to claim 14, wherein the light emitting element is an organic electroluminescent element in which a first electrode, an organic layer including a light emitting layer, and a second electrode are laminated sequentially.

16. The electronic device according to claim 15, wherein the organic electroluminescent element emits white light, and
the colored layers include a red colored layer, a green colored layer, and a blue colored layer extracting the white light as red light, green light, or blue light.

17. The electronic device according to claim 15, wherein the plurality of organic electroluminescent elements have a rectangular shape long in one direction, and arranged in a row direction parallel to a shorter side and in a column direction parallel to a longer side, and a pitch of the plurality of organic electroluminescent elements in the row direction is equal to or less than 30 μm.

18. The electronic device according to claim 14, wherein the semi-transmissive region is provided to face a border between the plurality of light emitting elements.

19. The electronic device according to claim 14, wherein the second semi-transmissive film is provided at a surface of the colored layer.

20. The electronic device according to claim 14, wherein the first semi-transmissive film is provided at a surface of the colored layer on a side away from the plurality of light emitting elements.

* * * * *